(12) United States Patent
Bang et al.

(10) Patent No.: US 12,408,381 B2
(45) Date of Patent: Sep. 2, 2025

(54) DISPLAY DEVICE AND MANUFACTURING METHOD THEREOF

(71) Applicant: SAMSUNG DISPLAY CO., LTD., Yongin-si (KR)

(72) Inventors: Seok Hwan Bang, Yongin-si (KR); Hyun Seong Kang, Cheonan-si (KR); Jong-In Kim, Seoul (KR); Joon Geol Kim, Hwaseong-si (KR); Seung Sok Son, Goyang-si (KR); Woo Geun Lee, Suwon-si (KR); Young Jae Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 606 days.

(21) Appl. No.: 17/646,973

(22) Filed: Jan. 4, 2022

(65) Prior Publication Data

US 2022/0336669 A1 Oct. 20, 2022

(30) Foreign Application Priority Data

Apr. 19, 2021 (KR) .................. 10-2021-0050596

(51) Int. Cl.
*H01L 29/786* (2006.01)
*H10D 30/01* (2025.01)
*H10D 30/67* (2025.01)

(52) U.S. Cl.
CPC ....... *H10D 30/6755* (2025.01); *H10D 30/031* (2025.01); *H10D 30/6723* (2025.01)

(58) Field of Classification Search
None
See application file for complete search history.

(56) References Cited

U.S. PATENT DOCUMENTS

2021/0036028 A1* 2/2021 Kim .................... H01L 27/1225
2022/0173128 A1* 6/2022 Kim .................. H01L 29/78633

FOREIGN PATENT DOCUMENTS

| JP | 2013130616 | 7/2013 |
|---|---|---|
| JP | 2017054899 | 3/2017 |
| KR | 10-2019-0002888 A | 1/2019 |
| KR | 10-2019-00456 | 5/2019 |
| KR | 10-2019-0076443 | 7/2019 |
| KR | 10-2021-0016111 A | 2/2021 |

* cited by examiner

*Primary Examiner* — Anthony Ho
(74) *Attorney, Agent, or Firm* — F. CHAU & ASSOCIATES, LLC

(57) ABSTRACT

A display device according to an embodiment includes: a substrate; a first conductive layer positioned on the substrate; a semiconductor layer positioned on the first conductive layer; a second conductive layer positioned on the semiconductor layer; an oxygen supply layer positioned under the second conductive layer, in contact with the second conductive layer, and having the same planar shape as the second conductive layer; and a light-emitting element connected to the second conductive layer, wherein the oxygen supply layer includes a metal oxide that includes one or more of indium, zinc, tin, or gallium, or alloys thereof.

20 Claims, 26 Drawing Sheets

DISPLAY DEVICE AND MANUFACTURING METHOD THEREOF

CROSS-REFERENCE TO RELATED APPLICATION

This application claims priority under 35 U.S.C § 119 from Korean Patent Application No. 10-2021-0050596, filed in the Korean Intellectual Property Office on Apr. 19, 2021, the contents of which are herein incorporated by reference in their entirety.

TECHNICAL FIELD

Embodiments of the present disclosure are directed to a display device and a manufacturing method thereof, and more specifically, to a manufacturing method that reduces the number of masks used in a manufacturing process, and a display device manufactured by this method.

DISCUSSION OF THE RELATED ART

Display devices that include thin film transistors are widely used. A typical thin film transistor includes a gate electrode, an active layer, a source electrode, and a drain electrode. A thin film transistor has a structure in which the active layer is positioned on the gate electrode or a structure in which the gate electrode is positioned on the active layer, depending on the structure in which the electrode is disposed.

When the gate electrode is positioned on the active layer, the active layer is directly exposed to light received from the lower part of the substrate. As a result, an optical leakage current may occur in the active layer, and defects such as a crosstalk may occur.

To prevent this, a light shielding film may be provided under the active layer. To provide such a light shielding film, a separate mask process is required. As a separate mask process is added, a number of manufacturing processes and a manufacturing cost may increase. In addition, to reduce the number of masks used, the active layer and an insulating layer that includes SiNx may directly contact each other, and in this case, hydrogen may flow into the active layer and thus the active might not function as a transistor.

SUMMARY

An embodiment provides a manufacturing method of a display device in which the number of masks used during a manufacturing process is reduced, and a display device manufactured by the manufacturing method.

A display device according to an embodiment includes: a substrate; a first conductive layer positioned on the substrate; a semiconductor layer positioned on the first conductive layer; a second conductive layer positioned on the semiconductor layer; an oxygen supply layer positioned under the second conductive layer, in contact with the second conductive layer, and having the same planar shape as the second conductive layer; and a light-emitting element connected to the second conductive layer, wherein the oxygen supply layer includes a metal oxide that includes one or more of indium, zinc, tin, or gallium, or alloys thereof.

The oxygen supply layer may be one of IGZO, ITO, ITGO, IZO, ZnO, or ITGZO.

The semiconductor layer may be an oxide semiconductor.

A composition of the oxygen supply layer and A composition of the semiconductor layer may be different.

The display device may further include an insulating layer positioned between the second conductive layer and the light-emitting element; and a metal oxide layer positioned between the insulating layer and the second conductive layer.

The metal oxide layer may include an oxide layer of at least one of aluminum, nickel, lanthanum, or AlNiLa, or alloys thereof.

A thickness of the metal oxide layer may be 200 Å or less.

The first conductive layer may include a light blocking layer that overlaps the semiconductor layer in a direction perpendicular to a surface of the substrate, and a source electrode and a drain electrode positioned on the same layer as the light blocking layer, and the second conductive layer may include a gate electrode that overlaps the semiconductor layer in the direction perpendicular to the surface of the substrate.

The display device may further include a groove formed in a region of the semiconductor layer that does not overlap the gate electrode in the direction perpendicular to the surface of the substrate, and the metal oxide layer may be directly in contact with a side of the semiconductor layer in the groove.

The display device may further include a gate insulating layer positioned on the semiconductor layer, a groove may be formed in a region of the semiconductor layer that does not overlap the gate electrode in the direction perpendicular to the surface of the substrate, and the oxygen supply layer and the semiconductor layer may be directly in contact in the groove.

The display device may further include a buffer layer positioned on the first conductive layer, and a second oxygen supply layer positioned between the buffer layer and the semiconductor layer, and the second oxygen supply layer may include a metal oxide that includes one or more of indium, zinc, tin, or gallium, or alloys thereof.

The display device may further include a pad electrode positioned on the same layer as the first conductive layer or the second conductive layer.

A method of manufacturing a display device according to an embodiment includes: forming a first conductive layer on a substrate; etching the first conductive layer to form a light blocking layer, a source electrode, and a drain electrode; forming a buffer layer on the etched first conductive layer; forming a semiconductor layer on the buffer layer; forming a gate insulating layer on the semiconductor layer; etching the buffer layer and the gate insulating layer to form a first opening that overlaps the source electrode, a second opening that overlaps the drain electrode, and to remove a part of the gate insulating layer from the semiconductor layer; forming an oxygen supply layer on the gate insulating layer, the source electrode, the semiconductor layer, and the drain electrode; forming a second conductive layer on the oxygen supply layer; and simultaneously etching the oxygen supply layer and the second conductive layer to form a gate electrode, a source connection electrode, and a drain connection electrode.

The oxygen supply layer may include a metal oxide that includes one or more of indium, zinc, tin, or gallium, or alloys thereof.

The source connection electrode may be in contact with the source electrode in the first opening, and the drain connection electrode may be in contact with the drain electrode in the second opening.

Simultaneously etching the oxygen supply layer and the second conductive layer may further include etching a part of the semiconductor layer to form a groove in the semiconductor layer.

The method may further include forming a metal layer on the gate insulating layer, the gate electrode, the source connection electrode, and the drain electrode, and forming a metal oxide layer by oxidizing the metal layer.

The metal oxide layer may be in direct contact with the side of the semiconductor layer in the groove of the semiconductor layer.

The metal oxide layer may include at least one of an oxide of aluminum, nickel, lanthanum, or AlNiLa, or alloys thereof.

The semiconductor layer may include an oxide semiconductor, and a composition of the oxygen supply layer and a composition of the semiconductor layer may be different.

A display device according to an embodiment includes: a substrate; a first conductive layer positioned on the substrate; a semiconductor layer positioned on the first conductive layer; a second conductive layer positioned on the semiconductor layer; a light-emitting element connected to the second conductive layer; an insulating layer positioned between the second conductive layer and the light-emitting element; and a metal oxide layer positioned between the insulating layer and the second conductive layer. The metal oxide layer includes an oxide layer of at least one of aluminum, nickel, lanthanum, or AlNiLa, or alloys thereof, and a thickness of the metal oxide layer is 200 Å or less.

The second conductive layer may include a gate electrode that overlaps the semiconductor layer in a direction perpendicular to a surface of the substrate, a groove may be formed in a region of the semiconductor layer that does not overlap the gate electrode in the direction perpendicular to the surface of the substrate, and the metal oxide layer may be directly in contact with a side of the semiconductor layer in the groove.

The display device may further include an oxygen supply layer positioned under the second conductive layer, in contact with the second conductive layer and having the same planar shape as the second conductive layer. The oxygen supply layer may include a metal oxide that includes one or more of indium, zinc, tin, or gallium, or alloys thereof.

The oxygen supply layer may be one of IGZO, ITO, ITGO, IZO, ZnO, or ITGZO, and the semiconductor layer may be an oxide semiconductor.

The display device may further include a gate insulating layer positioned on the semiconductor layer. The second conductive layer may include a gate electrode that overlaps the semiconductor layer in a direction perpendicular to a surface of the substrate, a groove may be formed in a region of the semiconductor layer that does not overlap the gate electrode in the direction perpendicular to the surface of the substrate, and the oxygen supply layer and the semiconductor layer are directly in contact in the groove.

The display device may further include a buffer layer positioned on the first conductive layer; and a second oxygen supply layer positioned between the buffer layer and the semiconductor layer. The second oxygen supply layer may include a metal oxide that includes one or more of indium, zinc, tin, or gallium, or alloys thereof.

The first conductive layer may include a light blocking layer that overlaps the semiconductor layer in a direction perpendicular to a surface of the substrate, and a source electrode and a drain electrode positioned on a same layer as the light blocking layer.

According to an embodiment, a manufacturing method of a display device uses a reduced number of masks, and a display device is manufactured by the manufacturing method.

DETAILED DESCRIPTION OF EMBODIMENTS

Figure 1:
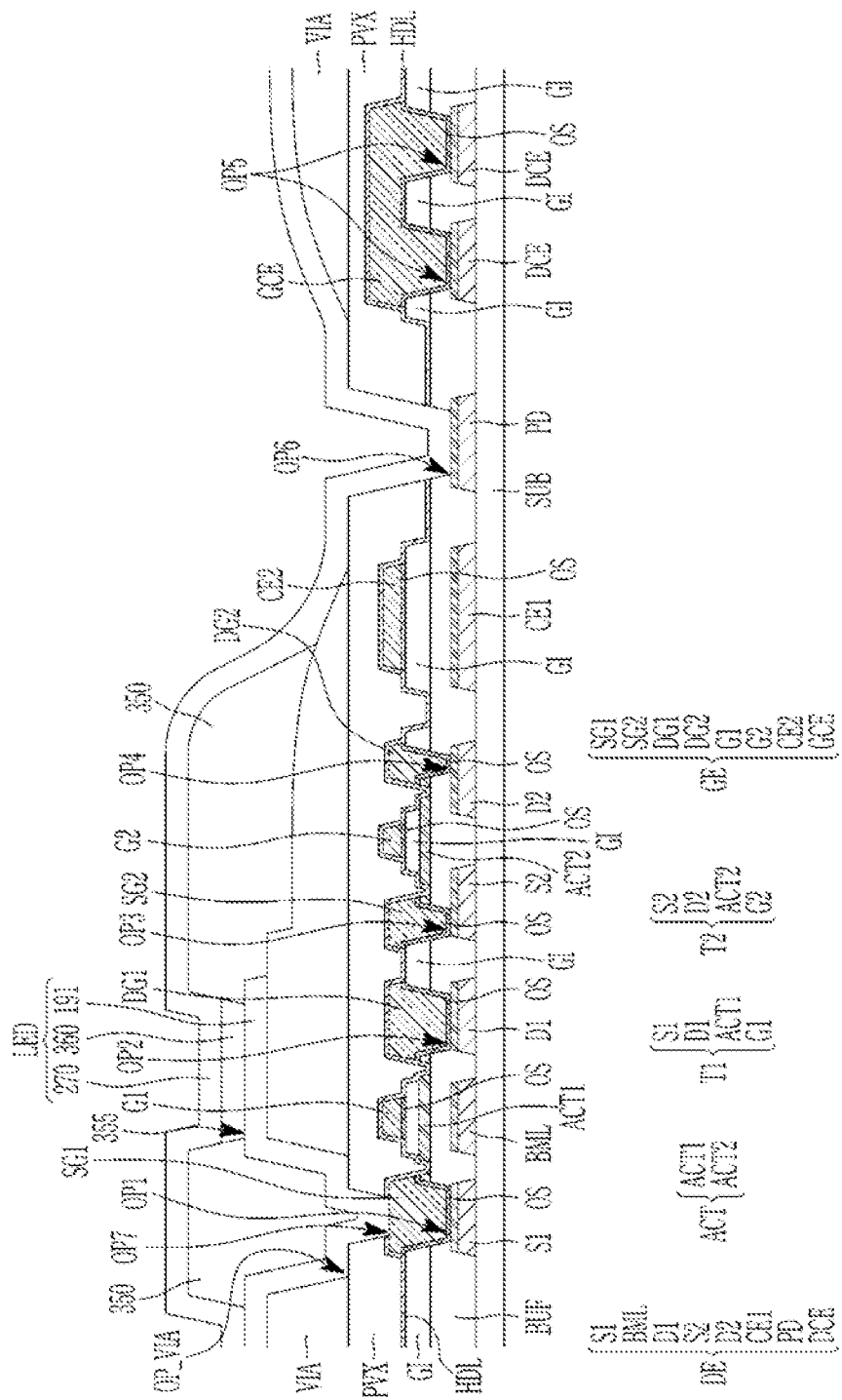
FIG. 1 schematically shows a cross-section of a display device according to an embodiment.

Embodiments of present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

Descriptions of parts not related to the present disclosure are omitted, and like reference numerals may designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a display device according to an embodiment of the present invention will be described below with reference to the accompanying drawings.

FIG. 1 schematically shows a cross-section of a display device according to an embodiment. For better comprehension and ease of description, FIG. 1 shows the cross-sections of several regions of the display device as one cross-section.

Referring to FIG. 1, a display device according to a present embodiment includes a data conductive layer DE disposed on a substrate SUB.

The substrate SUB may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. The substrate SUB may be a rigid substrate or a flexible substrate capable of bending, folding, or rolling. The substrate SUB may be single-layered or multi-layered. In an embodiment, the substrate SUB has a structure in which at least one base layer is alternately stacked with at least one inorganic layer that includes a polymer resin.

In an embodiment, the data conductive layer DE includes at least one of aluminum (Al), silver (Ag), magnesium (Mg), gold (Au), nickel (Ni), chromium (Cr), calcium (Ca), molybdenum (Mo), titanium (Ti), tungsten (W), or copper (Cu), and a metal oxide, and may have a single layer or a multi-layered structure that includes the same. The metal oxide includes at least one or more of indium (In), tin (Sn), gallium (GA), zinc (Zn), hafnium (Hf), or aluminum (Al). For example, the data conductive layer DE has a three-layer structure that includes titanium, copper, and ITO. The data conductive layer has a stacked structure of one of Ti/Cu/ITO, Ti/Cu/ITGO, Ti/Cu/Ti, and Ti/Cu/Ti/ITO. The data conductive layer DE is shown as a two-layer structure in FIG. 1, but is not limited thereto.

Referring to FIG. 1, in an embodiment, the data conductive layer DE includes a first source electrode S1, a first drain electrode D1, a second source electrode S2, a second drain electrode D2, a light blocking layer BML, a first storage electrode CE1, a pad electrode PD, and a data contact electrode DCE. The first source electrode S1, the first drain electrode D1, the second source electrode S2, the second drain electrode D2, the light blocking layer BML, the first storage electrode CE1, the pad electrode PD, and the data contact electrode DCE are formed by the same process, and include the same material and have the same stacked structure.

In an embodiment, the light blocking layer BML is positioned between the first source electrode S1 and the first drain electrode D1, and overlaps a first semiconductor layer ACT1 in a direction perpendicular to the surface of the substrate SUB. As described separately below, the first source electrode S1, the first drain electrode D1, the first semiconductor layer ACT1, and a first gate electrode G1 constitute a first transistor T1. The first transistor T1 is a driving transistor.

As described separately below, the second source electrode S2, the second drain electrode D2, a second semiconductor layer ACT2, and a second gate electrode G2 may constitute a second transistor. The second transistor T2 is a switching transistor.

In an embodiment, the first storage electrode CE1 overlaps in the direction perpendicular to the surface of the substrate SUB a second storage electrode CE2 that is a part of the gate conductive layer GE, and the first storage electrode CE1 and the second storage electrode CE2 constitute a capacitor.

In an embodiment, no insulating layer, etc., is disposed on the upper surface of the pad electrode PD. The pad electrode PD is in contact with a second electrode 270. The data contact electrode DCE is in contact with the gate contact electrode GCE.

In an embodiment, a buffer layer BUF is disposed on the data conductive layer DE. The buffer layer BUF includes at least one of silicon oxide ($SiO_x$), silicon nitride ($SiN_x$), silicon oxynitride ($SiO_xN_y$), or amorphous silicon (Si).

In an embodiment, a semiconductor layer ACT is disposed on the buffer layer BUF. The semiconductor layer ACT includes the first semiconductor layer ACT1 positioned between the first source electrode S1 and the first drain electrode D1 and the second semiconductor layer ACT2 positioned between the second source electrode S2 and the second drain electrode D2. The semiconductor layer ACT includes an oxide semiconductor. The oxide semiconductor includes at least one of indium (In), tin (Sn), zinc (Zn), hafnium (Hf), or aluminum (Al). For example, the semiconductor layer ACT includes Indium-Gallium-Zinc Oxide (IGZO).

In an embodiment, the first semiconductor layer ACT1 includes a channel region that overlaps the first gate electrode G1, and a source region and a drain region positioned in both sides of the channel region. Some of the source and drain regions may have grooves.

Similarly, in an embodiment, the second semiconductor layer ACT2 includes a channel region that overlaps the second gate electrode G2, and a source region and a drain region positioned on both sides of the channel region. Some of the source and drain regions may have grooves.

In an embodiment, a gate insulating layer GI is disposed on the semiconductor layer ACT. The gate insulating layer GI includes at least one of silicon oxide ($SiO_x$), silicon nitride ($SiN_x$), or silicon oxynitride ($SiO_xN_y$), and may have a single layer or a multi-layered structure.

In an embodiment, the buffer layer BUF and the gate insulating layer GI include a first opening OP1 that overlaps the first source electrode S1, a second opening OP2 that overlaps the first drain electrode D1, a third opening OP3 that overlaps the second source electrode S2, a fourth opening OP4 that overlaps the second drain electrode D2, a fifth opening OP5 that overlaps the data contact electrode DCE, and a sixth opening OP6 that overlaps the pad electrode PD. Each of the openings OP1 to OP6 penetrates through the buffer layer BUF and the gate insulating layer GI. In addition, the semiconductor layer ACT includes a region that does not overlap the gate insulating layer GI.

Next, in an embodiment, an oxygen supply layer OS is disposed in the openings OP1 to OP6 of the buffer layer BUF and the gate insulating layer GI.

In an embodiment, the oxygen supply layer OS includes a metal oxide that includes indium, zinc, gallium, or tin. For example, the oxygen supply layer may be one of IGZO, ITO, ITGO, IZO, ZnO, or ITGZO. The oxygen supply layer OS is disposed in the openings OP1 to OP6 of the buffer layer BUF and the gate insulating layer GI. In addition, the oxygen supply layer OS is disposed on the gate insulating layer GI where the gate insulating layer GI overlaps the semiconductor layer ACT. In addition, the oxygen supply layer OS is disposed on a portion of the gate insulating layer GI that overlaps the first storage electrode CE1 in the direction perpendicular to the surface of the substrate SUB.

In an embodiment, a gate conductive layer GE is disposed on the oxygen supply layer OS. The gate conductive layer GE includes at least one of molybdenum (Mo), aluminum (Al), copper (Cu), or titanium (Ti), and a metal oxide, and may have a single layer or multi-layered structure including the same. The metal oxide includes at least one or more of indium (In), tin (Sn), gallium (GA), zinc (Zn), hafnium (Hf), or aluminum (Al). For example, the gate conductive layer GE has a three-layer structure that includes titanium, copper, and ITO. The gate conductive layer may have a stacked structure of one of Ti/Cu/ITO, Ti/Cu/ITGO, Ti/Cu/Ti, or Ti/Cu/Ti/ITO.

In an embodiment, the gate conductive layer GE includes a first source connection electrode SG1, a first drain connection electrode DG1, the first gate electrode G1, a second source connection electrode SG2, a second drain connection electrode DG2, the second gate electrode G2, the second storage electrode CE2, and the gate contact electrode GCE. Referring to FIG. 1, the oxygen supply layer OS and the gate conductive layer GE have a same planar shape. That is, the oxygen supply layer OS is positioned under the gate conductive layer GE.

In an embodiment, the first source connection electrode SG1 is in contact with the first source electrode S1 through the first opening OP1. The first drain connection electrode DG1 is in contact with the first drain electrode D1 through the second opening OP2. The first gate electrode G1 overlaps the first semiconductor layer ACT1 in a direction perpendicular to the surface of the substrate SUB. The first source electrode S1, the first drain electrode D1, the first semiconductor layer ACT1, and the first gate electrode G1 constitute the first transistor T1. The first transistor T1 is the driving transistor.

In an embodiment, the second source connection electrode SG2 is in contact with the second source electrode S2 through the third opening OP3. The second drain connection electrode DG2 is in contact with the second drain electrode D2 through the fourth opening OP4. The second gate electrode G2 overlaps the second semiconductor layer ACT1 in a direction perpendicular to the surface of the substrate SUB. The second source electrode S1, the second drain electrode D2, the second semiconductor layer ACT2, and the second gate electrode G2 constitute the second transistor. The second transistor T2 is the switching transistor.

In an embodiment, the second storage electrode CE2 overlaps the first storage electrode CE1 in a direction perpendicular to the surface of the substrate SUB.

In an embodiment, the gate contact electrode GCE is in contact with the data contact electrode DCE through the fifth opening OP5.

In an embodiment, a hydrogen diffusion prevention layer HDL is disposed on the gate conductive layer GE. The hydrogen diffusion prevention layer HDL is disposed on the entire surface of the display device, and covers the gate insulating layer GI, the gate conductive layer GE, and the buffer layer BUF. In an embodiment, the thickness of the hydrogen diffusion prevention layer HDL is 200 Å or less. The hydrogen diffusion prevention layer HDL may be an oxide of aluminum, nickel, lanthanum, or alloys thereof. For example, the hydrogen diffusion prevention layer HDL includes $Al_2O_3$. In detail, the hydrogen diffusion prevention layer HDL may include an oxide of Al or an oxide of AlNiLa. In an embodiment, the hydrogen diffusion prevention layer HDL is formed by oxidizing a metal layer that includes Al or AlNiLa. The hydrogen diffusion prevention layer HDL prevents direct contact between a passivation layer PVX formed afterwards and the semiconductor layer ACT, thereby maintaining the transistor characteristics of the semiconductor layer ACT.

In an embodiment, a passivation layer PVX is disposed on the hydrogen diffusion prevention layer HDL. The passivation layer PVX includes at least one of silicon oxide ($SiO_x$), silicon nitride ($SiN_x$), or silicon oxynitride ($SiO_xN_y$), and may be a single layer or a multi-layered structure that includes the same. For example, the passivation layer PVX includes SiNx.

In an embodiment, when the semiconductor layer ACT includes an oxide semiconductor such as IGZO, the passivation layer PVX includes a $SiN_x$, and the semiconductor layer ACT and the passivation layer PVX directly contact each other, an ON/OFF characteristic of the transistor is not secured due to the conductorization of the semiconductor layer ACT. However, in a present embodiment, when the hydrogen diffusion prevention layer HDL that includes a metal oxide layer is provided, hydrogen diffusion from the passivation layer PVX is prevented and the semiconductor characteristic of the semiconductor layer ACT is maintained.

In an embodiment, the passivation layer PVX and the hydrogen diffusion prevention layer HDL include a seventh opening OP7 that overlaps the first source connection electrode SG1 and the sixth opening OP6 that overlaps the pad electrode PD.

In an embodiment, an insulating layer VIA is disposed on the passivation layer PVX. The insulating layer VIA includes an organic insulating material such as a generally-used polymer such as poly(methyl methacrylate) (PMMA) or polystyrene (PS), a polymer derivative that includes a phenol-based group, an acryl-based polymer, an imide-based polymer, a polyimide, an acryl-based polymer, or a siloxane-based polymer.

In an embodiment, the insulating layer VIA includes an opening OP_VIA that overlaps the seventh opening OP7. The seventh opening OP7 is located within the opening OP_VIA. The insulating layer VIA is not positioned around the pad electrode PD. That is, as shown in FIG. 1, the insulating layer VIA is removed from a region that overlaps the pad electrode PD in the direction perpendicular to the surface of the substrate SUB. In addition, the thickness of the insulating layer VIA around the pad electrode PD is thinner than in other regions. That is, as shown in FIG. 1, the thickness of the insulating layer VIA gradually decreases as it approaches the pad electrode PD from the opening OP_VIA of the insulating layer.

In an embodiment, a first electrode 191 is disposed on the insulating layer VIA. The first electrode 191 is in contact with the first source connection electrode SG1 in the opening OP_VIA of the insulating layer VIA. The first source connection electrode SG1 is in contact with the first source electrode S1 of the first transistor T1, and the first electrode 191 receives a data voltage from the first transistor T1.

In an embodiment, a partition wall 350 is disposed on the insulating layer VIA. The partition wall 350 includes an organic insulating material such as a generally-used polymer such as poly(methyl methacrylate) (PMMA) or polystyrene (PS), a polymer derivative that includes a phenol-based group, an acryl-based polymer, an imide-based polymer, a polyimide, an acryl-based polymer, or a siloxane-based polymer.

In an embodiment, the partition wall 350 includes an opening 355 that overlaps the first electrode 191. An emission layer 360 is disposed within the opening 355. The second electrode 270 is disposed on the emission layer 360. The first electrode 191, the emission layer 360, and the second electrode 270 constitute a light-emitting element (LED).

As described above, in a display device according to a present embodiment, the source electrode, the drain electrode, and the light blocking layer are positioned on the same layer, the oxygen supply layer OS is positioned below the semiconductor layer ACT, and the hydrogen diffusion prevention layer HDL is positioned above the semiconductor layer ACT. Therefore, by providing the oxygen supply layer OS and the hydrogen diffusion prevention layer HDL, an over-expression of the characteristics of the semiconductor layer ACT can be prevented when the SiNx of the passivation layer PVX and the semiconductor layer ACT are directly in contact each other.

Figure 2:
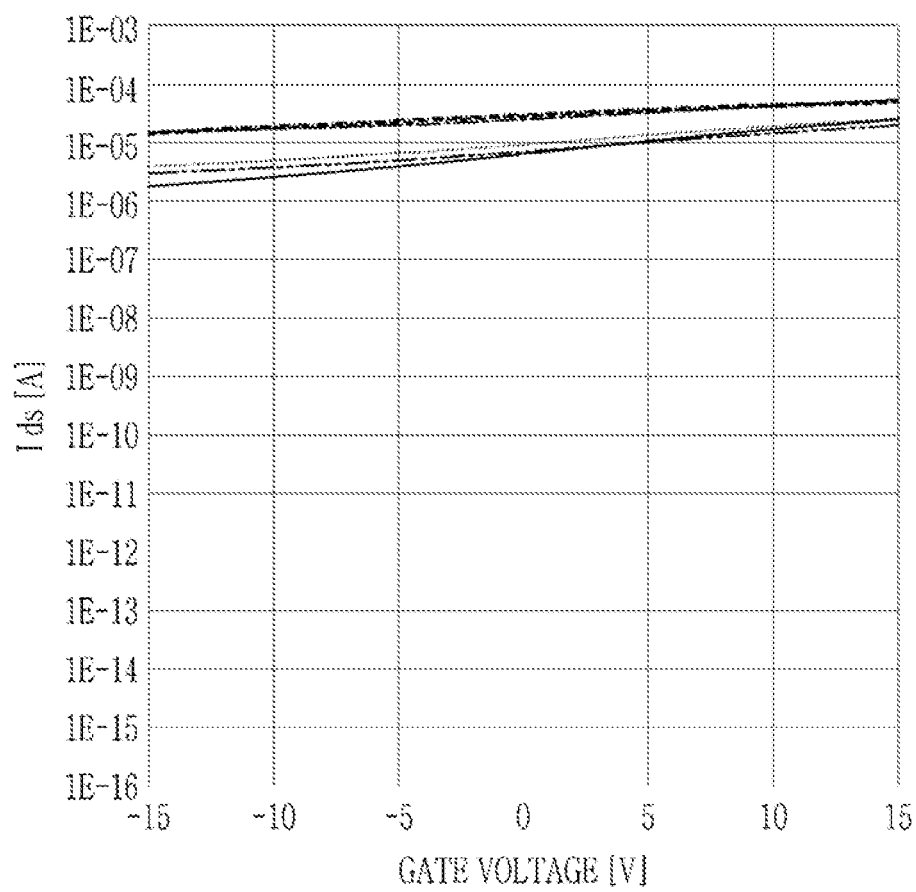
FIG. 2 shows a V-I graph for a driving transistor of a display device in which IGZO of a semiconductor layer and a SiNx of a passivation layer are directly in contact with each other without a hydrogen diffusion prevention layer.

FIG. 2 shows a V-I graph of a driving transistor of a display device in which IGZO of a semiconductor layer and SiNx of a passivation layer are directly in contact with each other, without a hydrogen diffusion prevention layer. FIG. 2 shows that a threshold voltage did not appear for a display device that lacks the hydrogen diffusion prevention layer HDL. That is, the semiconductor loses the ON/OFF characteristic.

Figure 3:
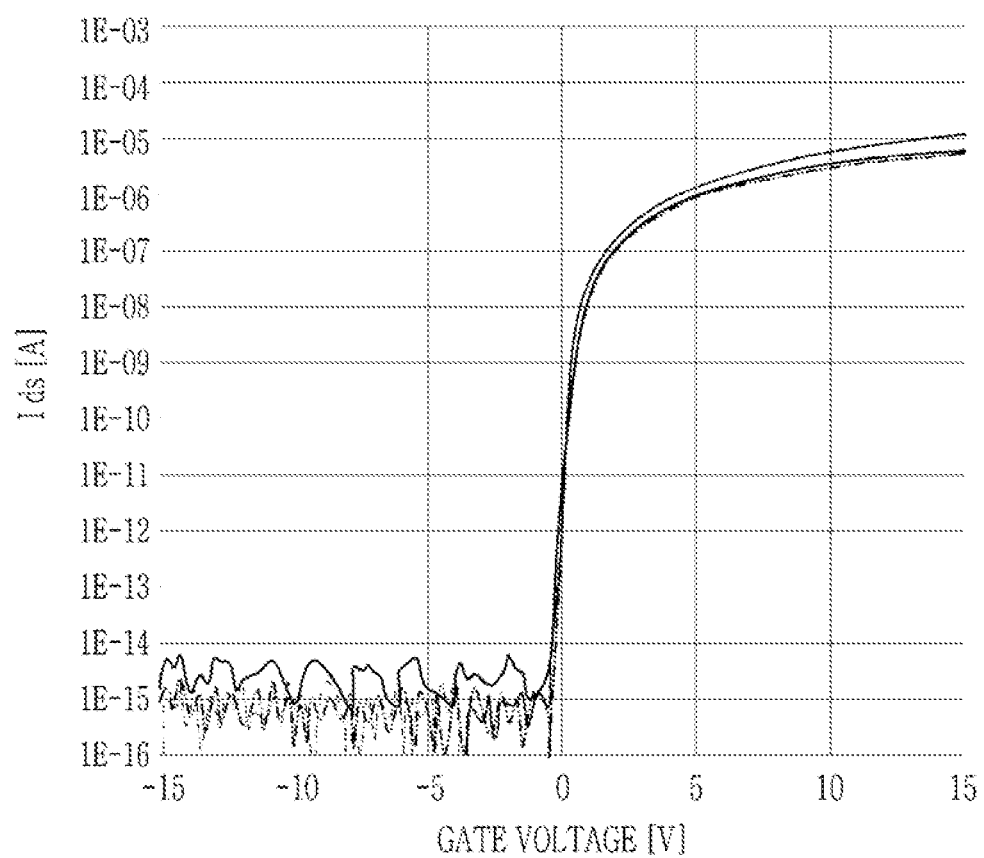
FIG. 3 shows a V-I graph for a driving transistor of a display device in which IGZO of a semiconductor layer and a SiNx of a passivation layer are not directly in contact with each other by including a hydrogen diffusion prevention layer.

FIG. 3 shows a V-I graph of a driving transistor of a display device in which IGZO of a semiconductor layer and SiNx of a passivation layer are separated from each other by a hydrogen diffusion prevention layer. FIG. 3 shows that the threshold voltage is 0.75 V when the display device includes the hydrogen diffusion prevention layer HDL. That is, unlike FIG. 2, the semiconductor does not lose the ON/OFF characteristic.

In addition, in a display device according to a present embodiment, the source electrode, the drain electrode, and the light blocking layer are positioned on the same layer, which reduces the number of the masks used in the manufacturing process, thereby simplifying the process. In a display device according to a present embodiment, a structure that includes the first electrode 191 and the partition wall 350 is referred to as a transistor display panel, which is a structure that excludes the emission layer and the second electrode in FIG. 1, and the transistor display panel can be manufactured using seven masks. Therefore, the manufacturing process can be economically simplified.

A manufacturing method of a display device according to a present embodiment is described in detail below with reference to the accompanying drawings of a specific manufacturing process.

FIG. 4 to FIG. 18 are cross-sectional views that show a manufacturing process of a display device according to an embodiment.

Figure 4:
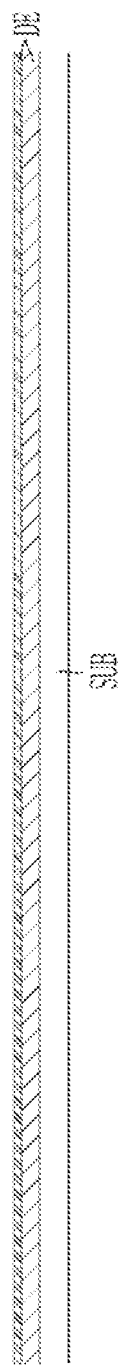
FIG. 4 to FIG. 18 are cross-sectional views that show a manufacturing process of a display device according to an embodiment.

First, referring to FIG. 4, in an embodiment, a data conductive layer DE material is formed on an entire surface of a substrate SUB. In an embodiment, the data conductive layer DE material includes at least one of aluminum (Al), silver (Ag), magnesium (Mg), gold (Au), nickel (Ni), chromium (Cr), calcium (Ca), molybdenum (Mo), titanium (Ti), tungsten (W), or copper (Cu), and may be a single layer or a multi-layered structure that includes the same. For example, the data conductive layer DE is a dual-layered structure that includes titanium and copper. FIG. 4 shows the data conductive layer DE as having a dual-layered structure.

Figure 5:
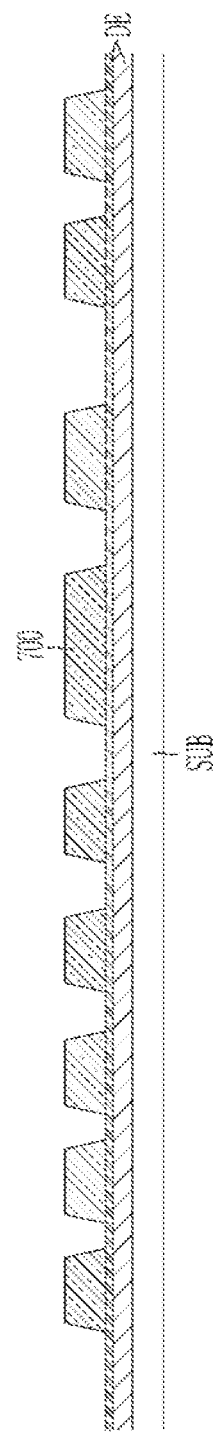

Next, referring to FIG. 5, in an embodiment, a photoresist 700 is positioned on the data conductive layer DE and patterned. One mask is used in the patterning process of the photoresist 700.

Figure 6:
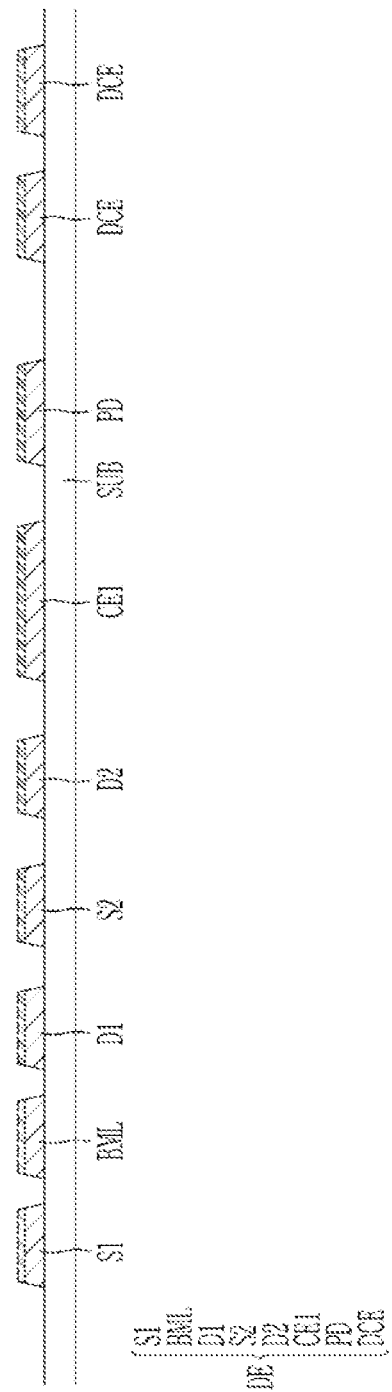

Now, referring to FIG. 6, in an embodiment, the data conductive layer DE is patterned using the patterned photoresist 700. By patterning the data conductive layer DE, a first source electrode S1, a first drain electrode D1, a second source electrode S2, a second drain electrode D2, a light blocking layer BML, a storage electrode Cl, a pad electrode PD, and a data contact electrode DCE are formed.

Figure 7:
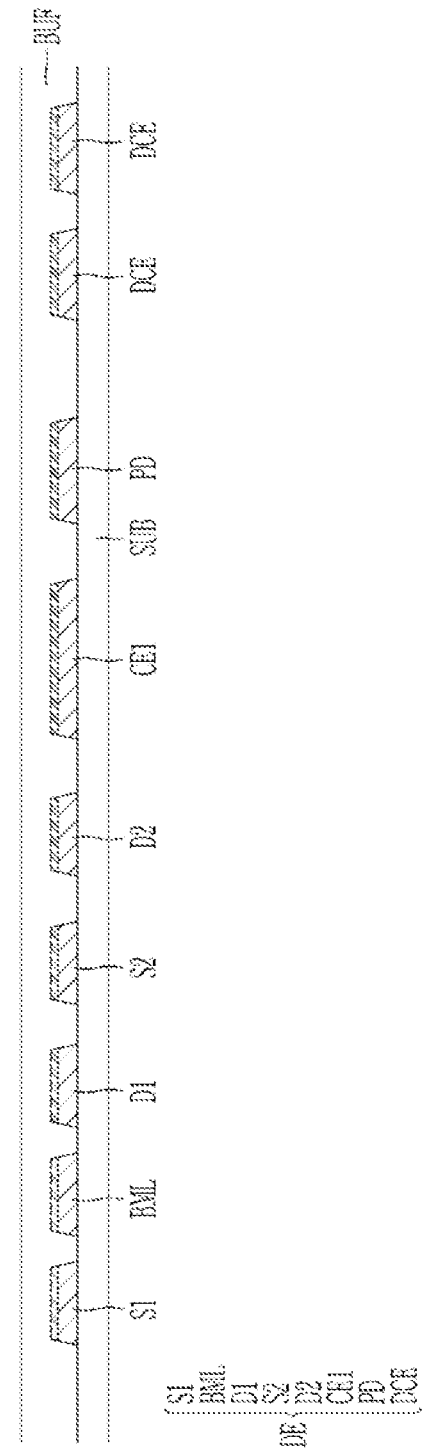

Next, referring to FIG. 7, in an embodiment, a buffer layer BUF is formed on the data conductive layer DE. The buffer layer BUF includes at least one of silicon oxide (SiO$_x$), silicon nitride (SiN$_x$), silicon oxynitride (SiO$_x$N$_y$), or amorphous silicon (Si).

Figure 8:
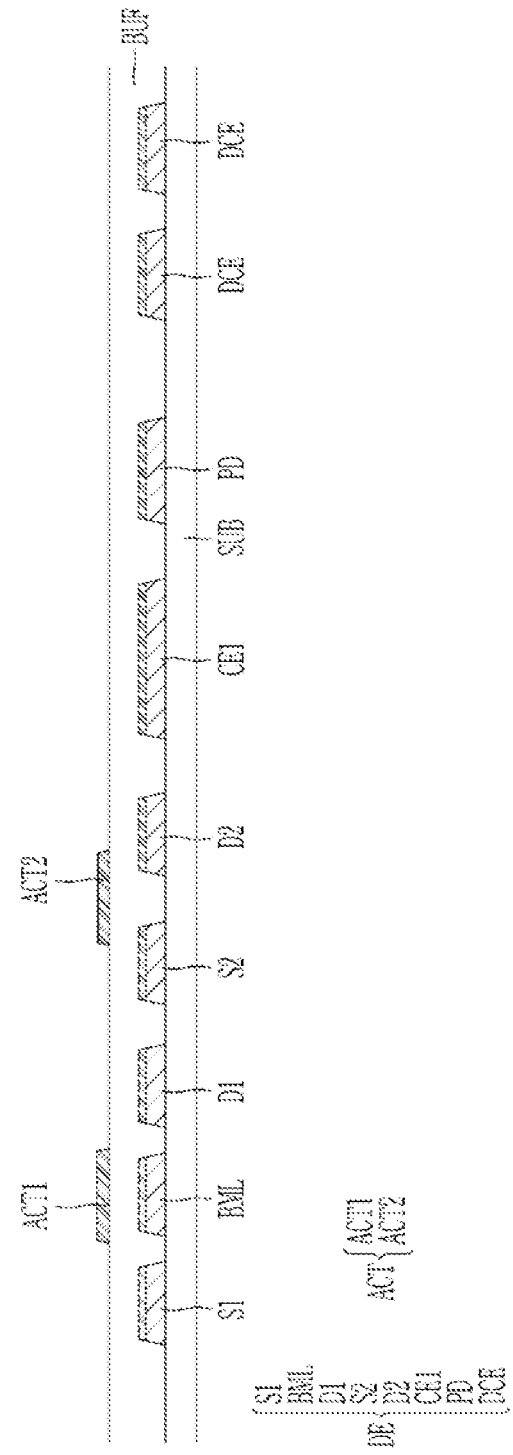

Next, referring to FIG. 8, in an embodiment, a semiconductor layer ACT is formed on the buffer layer BUF. The semiconductor layer ACT includes an oxide semiconductor. The oxide semiconductor includes at least one of indium (In), tin (Sn), zinc (Zn), hafnium (Hf), or aluminum (Al). For example, the semiconductor layer ACT includes Indium-Gallium-Zinc Oxide (IGZO). The semiconductor layer ACT material is formed on the entire surface and patterned into a first semiconductor layer ACT1 and a second semiconductor layer ACT2. In this process, one mask is used. (Two masks have been used so far.)

Figure 9:
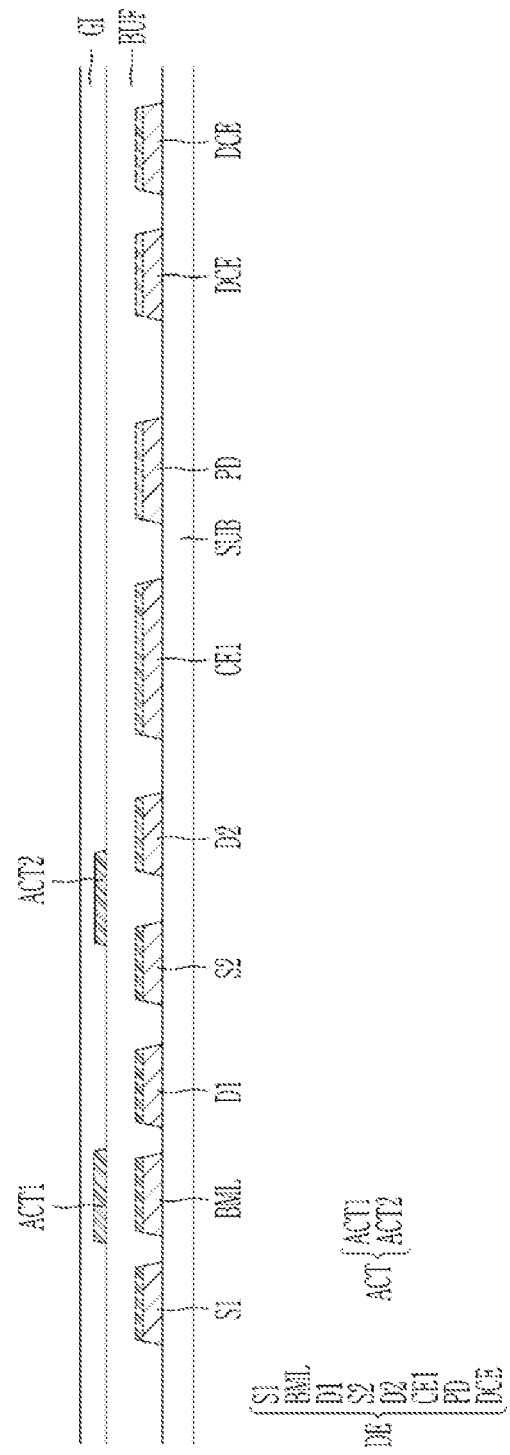

Next, referring to FIG. 9, in an embodiment, a gate insulating layer GI is formed on the semiconductor layer ACT. The gate insulating layer GI includes at least one of silicon oxide (SiO$_x$), silicon nitride (SiN$_x$), or silicon oxynitride (SiO$_x$N$_y$), and may have a single layer or a multi-layered structure.

Figure 10:
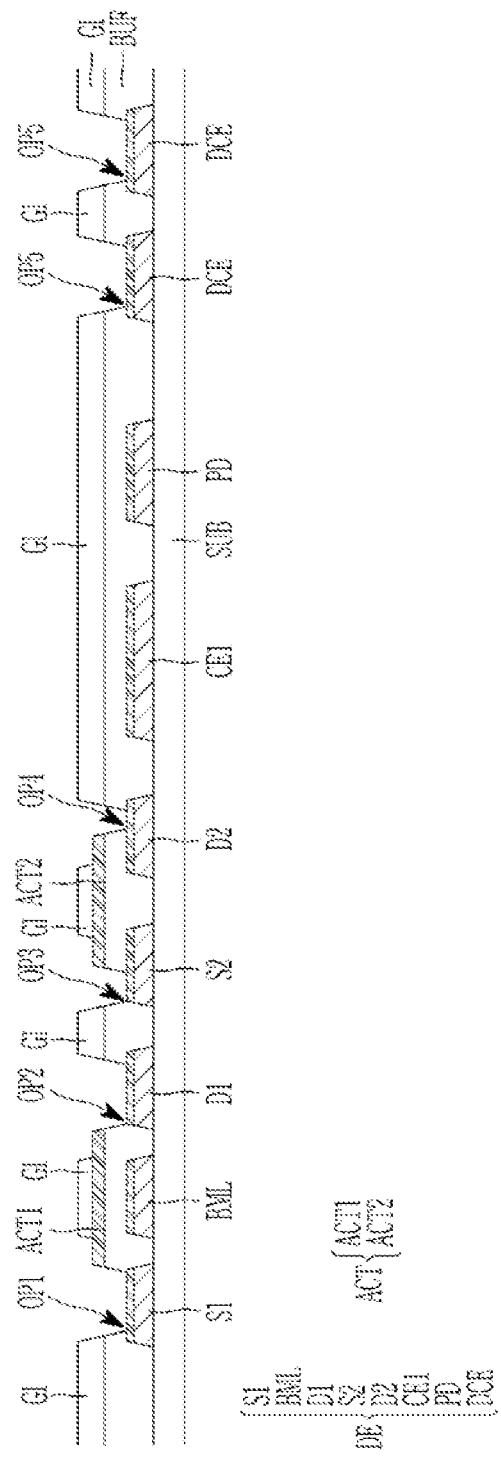

Next, referring to FIG. 10, in an embodiment, the gate insulating layer GI and the buffer layer BUF are etched by using a mask. In this process, one mask is used. (Three masks have been used so far.)

In an embodiment, a first opening OP1 to a fifth opening OP5 are formed by the etching of the gate insulating layer GI and the buffer layer BUF. Specifically, a first opening OP1 that overlaps the first source electrode S1, a second opening OP2 that overlaps the first drain electrode D1, a third opening OP3 that overlaps the second source electrode S2, a fourth opening OP4 that overlaps the second drain electrode D2, and a fifth opening OP5 that overlaps the data contact electrode DCE are formed.

In addition, in an embodiment, during this process, a portion of the gate insulating layer GI that was positioned on the upper surface of the semiconductor layer ACT is partially etched to expose the upper surface of the semiconductor layer ACT. That is, a portion of the semiconductor layer ACT does not overlap the gate insulating layer GI in the direction perpendicular to the surface of the substrate SUB.

Figure 11:
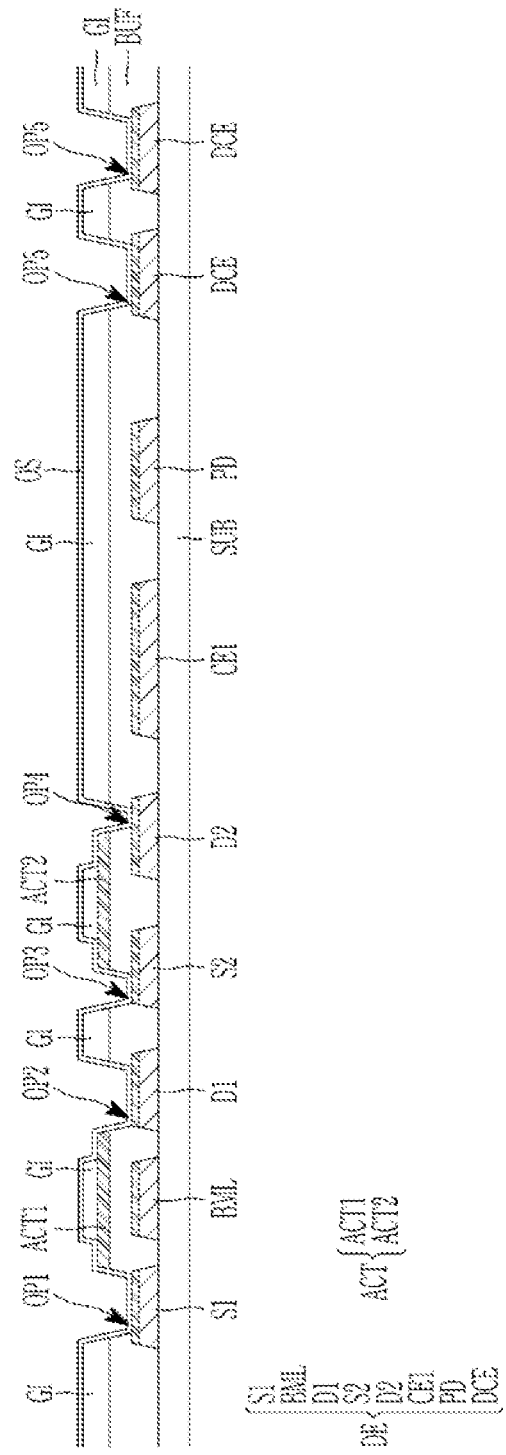

Next, referring to FIG. 11, in an embodiment, an oxygen supply layer OS is formed on the entire surface of the display device. The oxygen supply layer OS includes a metal oxide that includes indium, zinc, or tin. For example, the oxygen supply layer is one of IGZO, ITO, ITGO, IZO, ZnO, or ITGZO.

Figure 12:
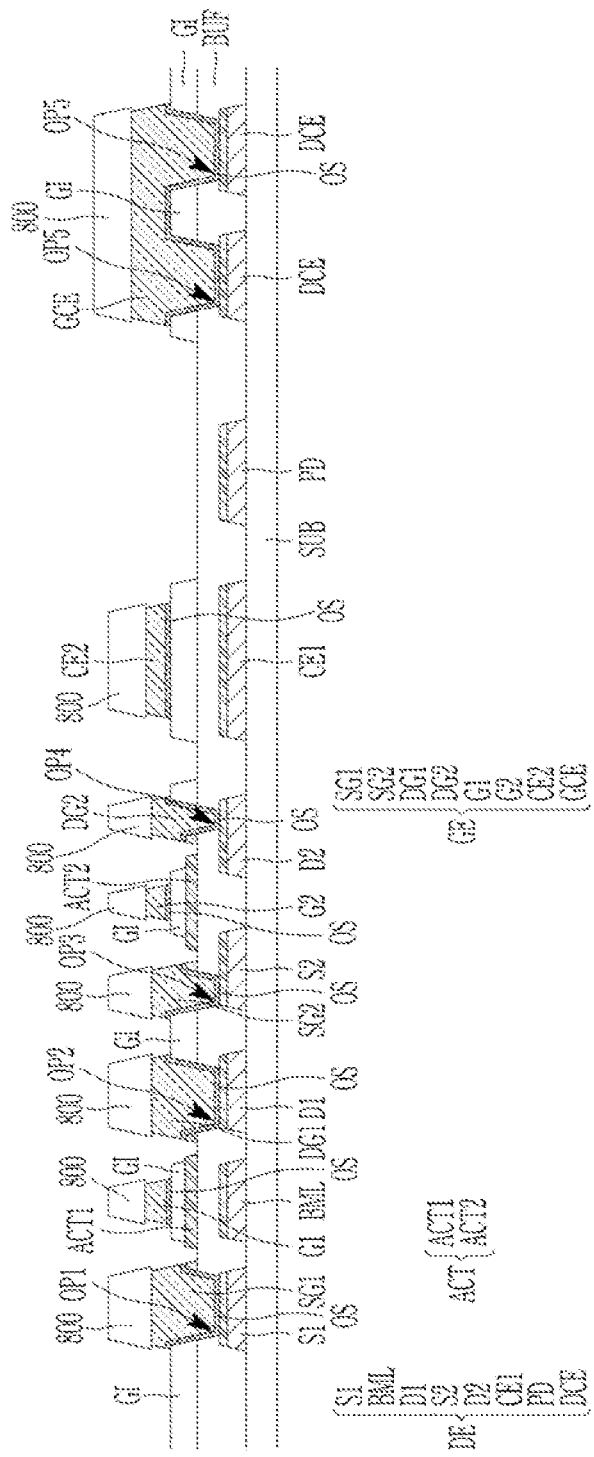

Next, referring to FIG. 12, in an embodiment, a gate conductive layer GE is formed on the oxygen supply layer OS, and the gate conductive layer GE and the oxygen supply layer OS are etched by using a patterned photoresist 700. In this process, one mask is used. (Four masks have been used so far.)

In an embodiment, the gate conductive layer GE may include molybdenum (Mo), aluminum (Al), copper (Cu), and/or titanium (Ti), and may be a single layer or a multi-layered structure.

FIG. 12 shows the gate conductive layer GE etched by using a patterned photoresist 800. By etching the gate conductive layer GE, a first source connection electrode SG1, a first drain connection electrode DG1, a first gate electrode G1, a second source connection electrode SG2, a second drain connection electrode DG2, a second gate electrode G2, a second storage electrode CE2, and a gate contact electrode GCE are formed.

As shown in FIG. 12, in an embodiment, since the oxygen supply layer OS is etched along with the gate conductive layer GE, the gate conductive layer GE and the oxygen supply layer OS have the same planar shape. That is, the oxygen supply layer OS overlaps with the gate conductive layer GE, and the oxygen supply layer OS is not present in a region where the gate conductive layer GE is not present.

In addition, referring to FIG. 12, in an embodiment, in the etching process of the gate conductive layer GE and the oxygen supply layer OS, parts of the first semiconductor layer ACT1 and the second semiconductor layer ACT2 are etched. As shown in FIG. 12, regions of the first semiconductor layer ACT1 positioned on both sides of the first gate electrode G1 are etched. Similarly, regions of the second semiconductor layer ACT2 positioned on both sides of the second gate electrode G2 are etched. In the cross-section of FIG. 12, the first semiconductor layer ACT1 and the second semiconductor layer ACT2 appear to be separated by the etching of some regions, but the first semiconductor layer ACT1 is connected and not separated on the plane. Only some regions of the second semiconductor layer ACT2 are etched, and are connected without being separated on a plane.

Figure 13:
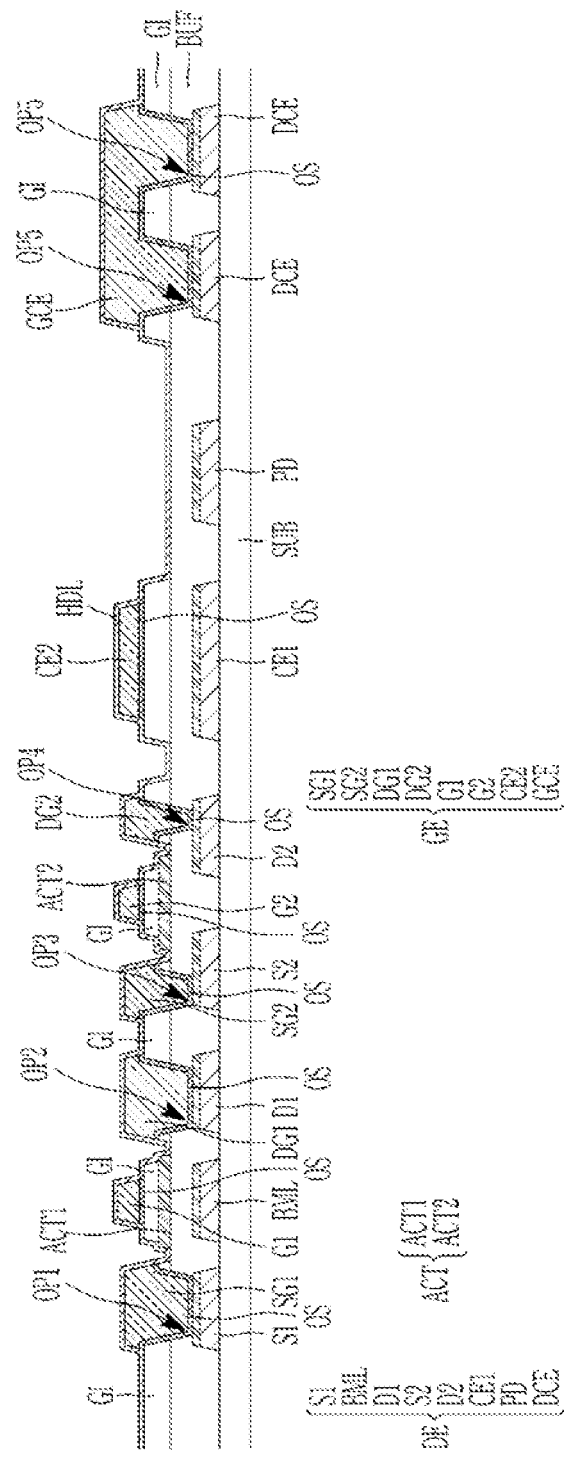

Next, referring to FIG. 13, in an embodiment, a hydrogen diffusion prevention layer HDL is formed on the entire surface of the display device. In an embodiment, the thickness of the hydrogen diffusion prevention layer HDL is 200 Å or less. The hydrogen diffusion prevention layer HDL is formed by first forming a layer of one or more of aluminum, nickel, or lanthanum, or their alloys, and then oxidizing them through a $N_2O$ treatment. That is, the hydrogen diffusion prevention layer HDL is formed of a metal oxide layer through an oxidation process after forming the metal layer. For example, the hydrogen diffusion prevention layer HDL includes $Al_2O_3$. In detail, the hydrogen diffusion prevention layer includes an oxide of Al or an oxide of AlNiLa. The hydrogen diffusion prevention layer HDL prevents direct contact between the passivation layer PVX formed afterwards and the semiconductor layer ACT, thereby maintaining the semiconducting characteristics of the semiconductor layer ACT. For a metal oxide layer, since hydrogen transmittance is low in a silicon oxide layer such as SiOX (the hydrogen transmittance of $Al_2O_3$ is $\frac{1}{10}$ the the hydrogen transmittance of SiOX), hydrogen in the passivation layer PVX is blocked from diffusing into the semiconductor layer ACT.

Figure 14:
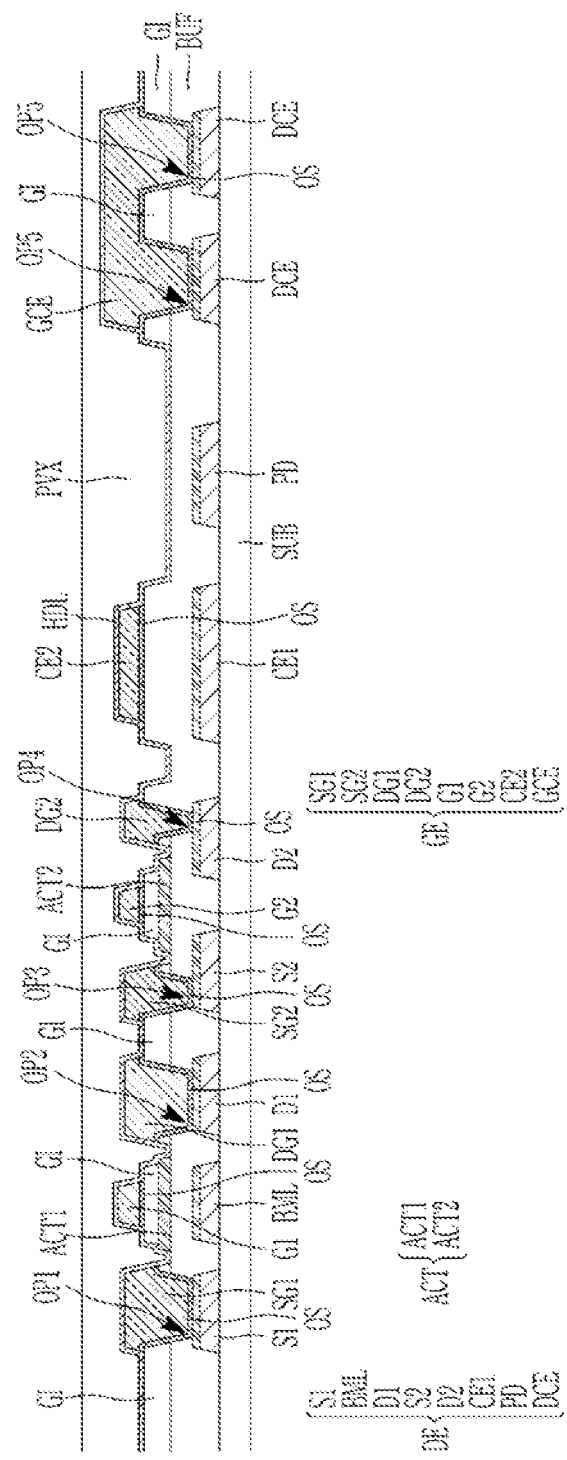

Next, referring to FIG. 14, in an embodiment, a passivation layer PVX is formed on the hydrogen diffusion prevention layer HDL. The passivation layer PVX includes at least one of silicon oxide ($SiO_x$), silicon nitride ($SiN_x$), or silicon oxynitride ($SiO_xN_y$), and may be a single layer or a multilayered structure that includes the same. For example, the passivation layer PVX includes SiNx.

Figure 15:
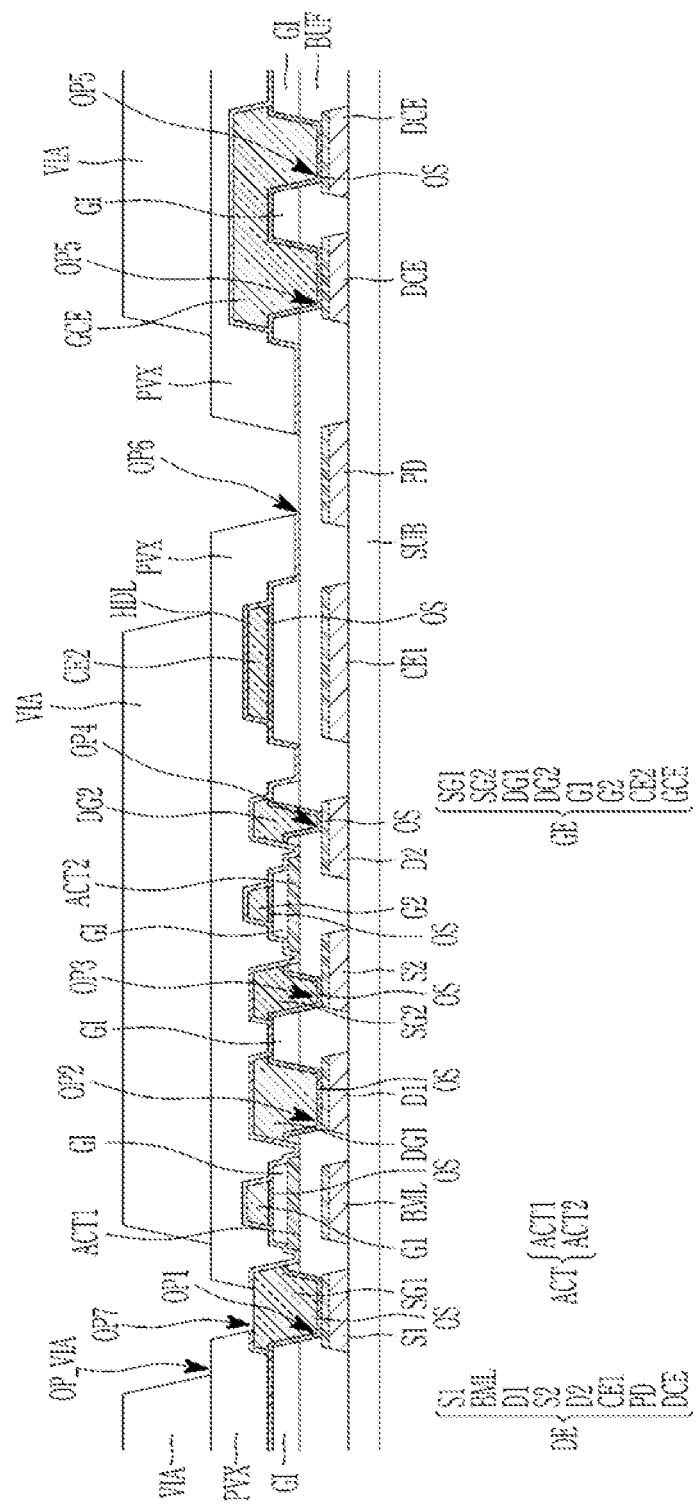

Next, referring to FIG. 15, in an embodiment, an insulating layer VIA is formed on the passivation layer PVX and patterned using a mask. In this process, one mask is used. (Five masks have been used so far.)

In an embodiment, the insulating layer VIA includes an organic insulating material such as a generally-used polymer such as poly(methyl methacrylate) (PMMA) or polystyrene (PS), a polymer derivative that includes a phenol-based group, an acryl-based polymer, an imide-based polymer, a polyimide, an acryl-based polymer, or a siloxane-based polymer.

As shown in FIG. 15, in an embodiment, through a patterning process of the passivation layer PVX and the insulating layer VIA, a seventh opening OP7 that overlaps the first source connection electrode SG1 and a sixth opening OP6 that overlaps the pad electrode PD are formed. In addition, an opening OP_VIA of the insulating layer VIA is formed.

In an embodiment, the seventh opening OP7 is formed as the insulating layer VIA, the passivation layer PVX, and the hydrogen diffusion prevention layer HDL are etched. The sixth opening OP6 is formed as the insulating layer VIA, the passivation layer PVX, and the hydrogen diffusion prevention layer HDL are etched.

Figure 16:
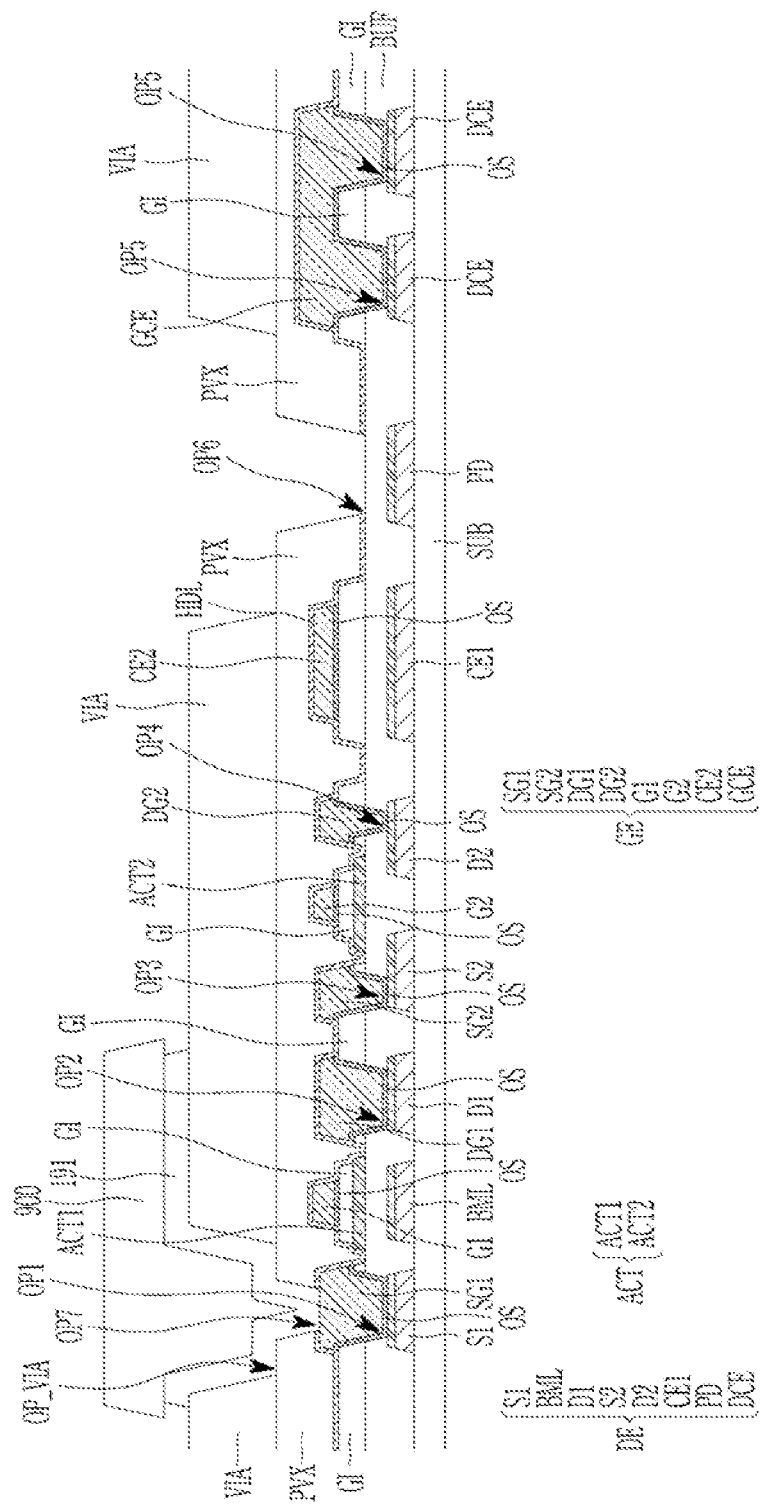

Next, referring to FIG. 16, in an embodiment, the first electrode 191 is formed on the insulating layer VIA, and the first electrode 191 is etched using a patterned photoresist 900. In this process, one mask is used. (Six masks have been used so far.)

Figure 17:
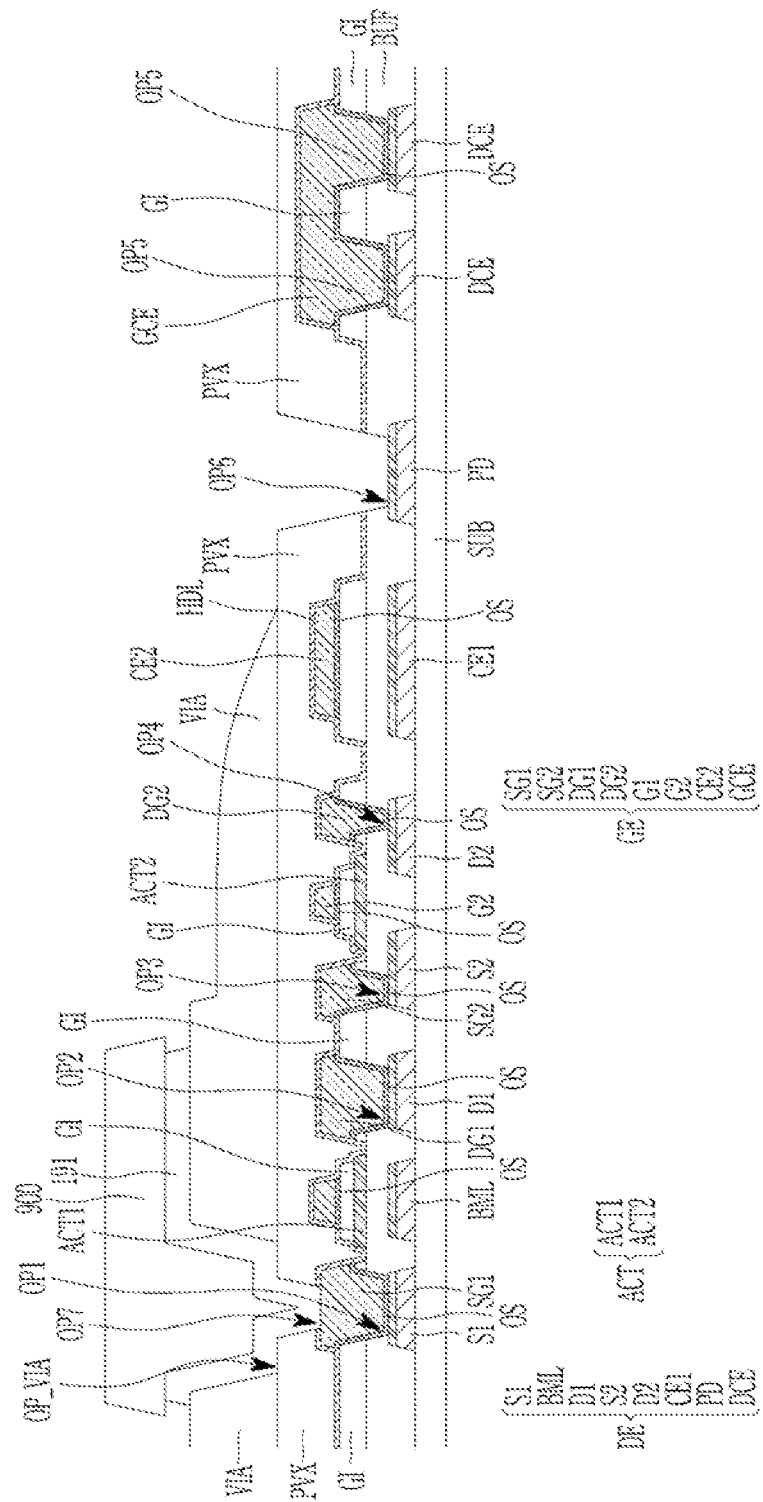

Next, referring to FIG. 17, in an embodiment, the insulating layer VIA and the buffer layer BUF are etched without removing the patterned photoresist 900. In this process, the thickness of the insulating layer VIA1 close to the pad electrode PD gradually decreases, and the buffer layer BUF in the sixth opening OP6 is removed, thereby exposing the pad electrode PD. As the thickness of the insulating layer VIA around the pad electrode PD decreases, the connection of the pad electrode PD is facilitated.

Figure 18:
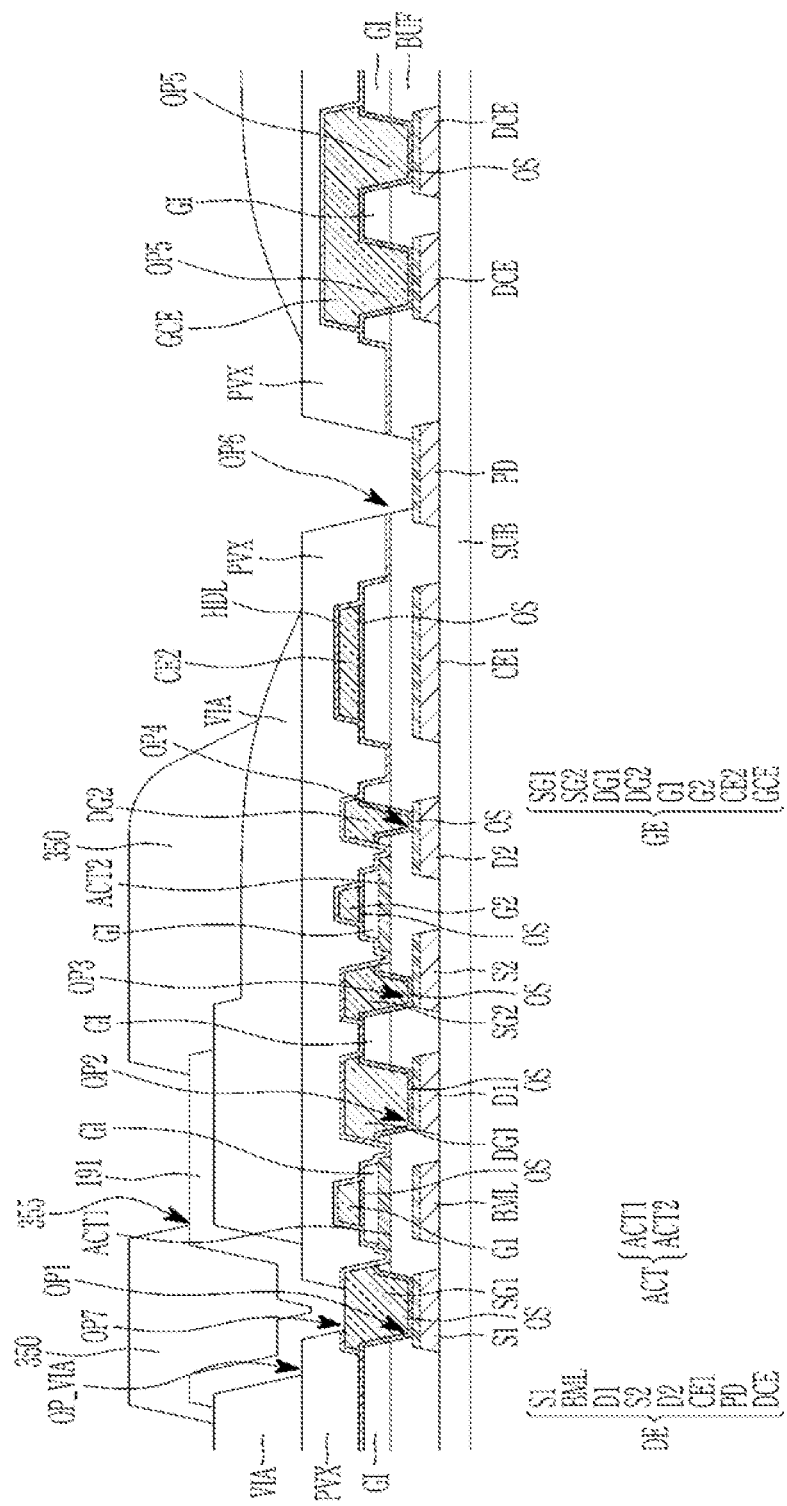

Now referring to FIG. 18, in an embodiment, a partition wall 350 is formed using one mask. (Up to now, seven masks have been used.)

In an embodiment, the partition wall 350, as shown in FIG. 18, includes an opening 355 that overlaps a portion of the first electrode 191.

In addition, in an embodiment, the emission layer 360 is formed in the opening of the partition wall 350 and the second electrode 270 is formed on the emission layer 360, and thus a display device that has the same structure as FIG. 1 is formed.

That is, a display device according to a present embodiment includes a transistor display panel that includes the first electrode 191 and the partition wall 350 is manufactured by using 7 masks, so the manufacturing process is economical. In addition, since the oxygen supply layer OS is positioned below the semiconductor layer ACT and the hydrogen diffusion prevention layer HDL is positioned above the semiconductor layer ACT, a transistor that includes the semiconductor layer ACT operates stably and reliably.

Figure 19:
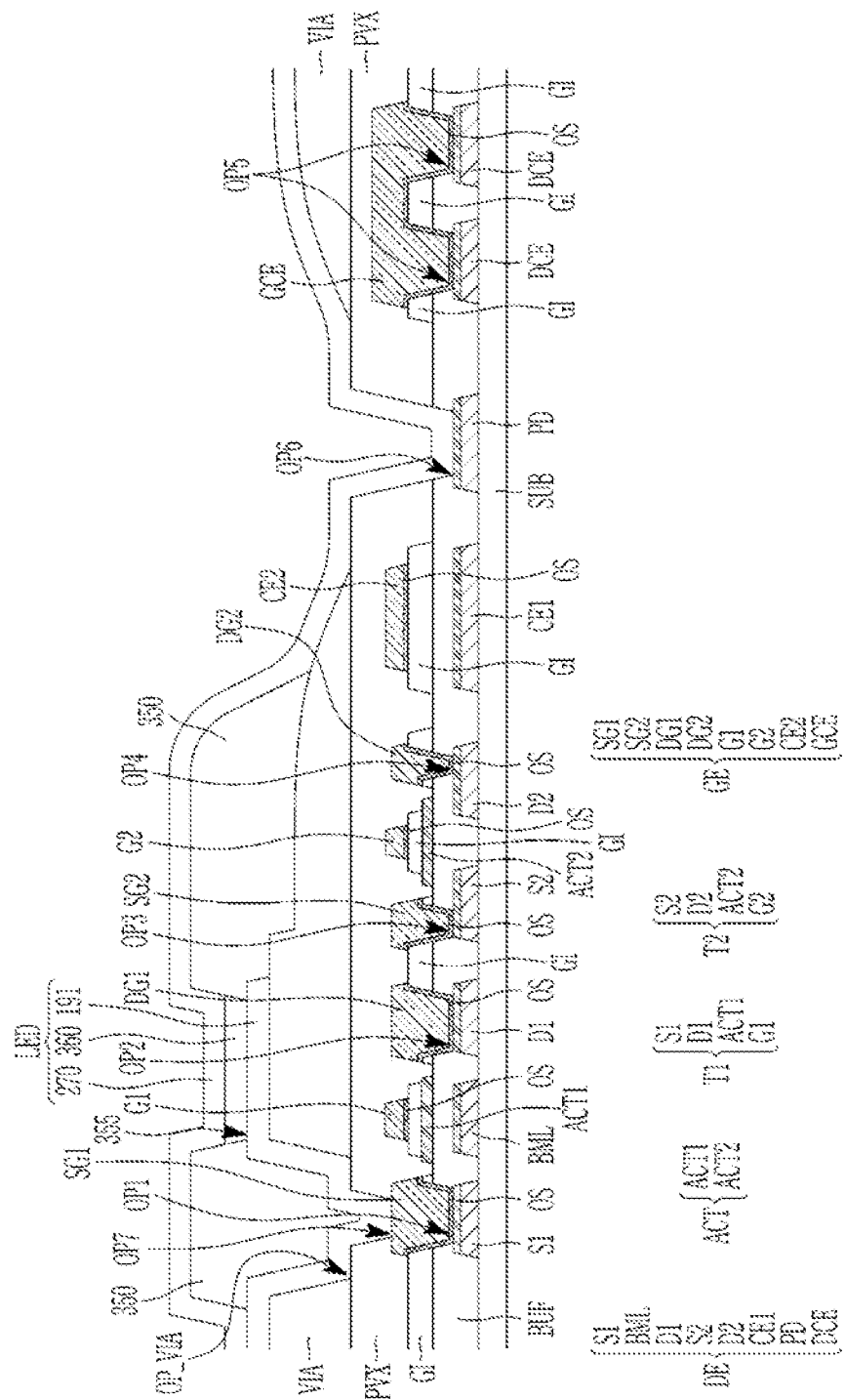
FIG. 19 is the same cross-section as that of FIG. 1 for a display device according to an embodiment.

A display device according to an embodiment is described below. FIG. 19 is the same cross-section as that of FIG. 1 for a display device according to an embodiment. Referring to FIG. 19, a display device according to a present embodiment is the same as a display device of FIG. 1, except that the hydrogen diffusion prevention layer HDL is omitted. A detailed description of the same constituent elements is omitted. Referring to FIG. 19, in a display device according to a present embodiment, the hydrogen diffusion prevention layer HDL is omitted and only the oxygen supply layer OS is included. Even in this case, the performance of the semiconductor layer ACT can be stably maintained by the oxygen supply layer OS.

Figure 20:
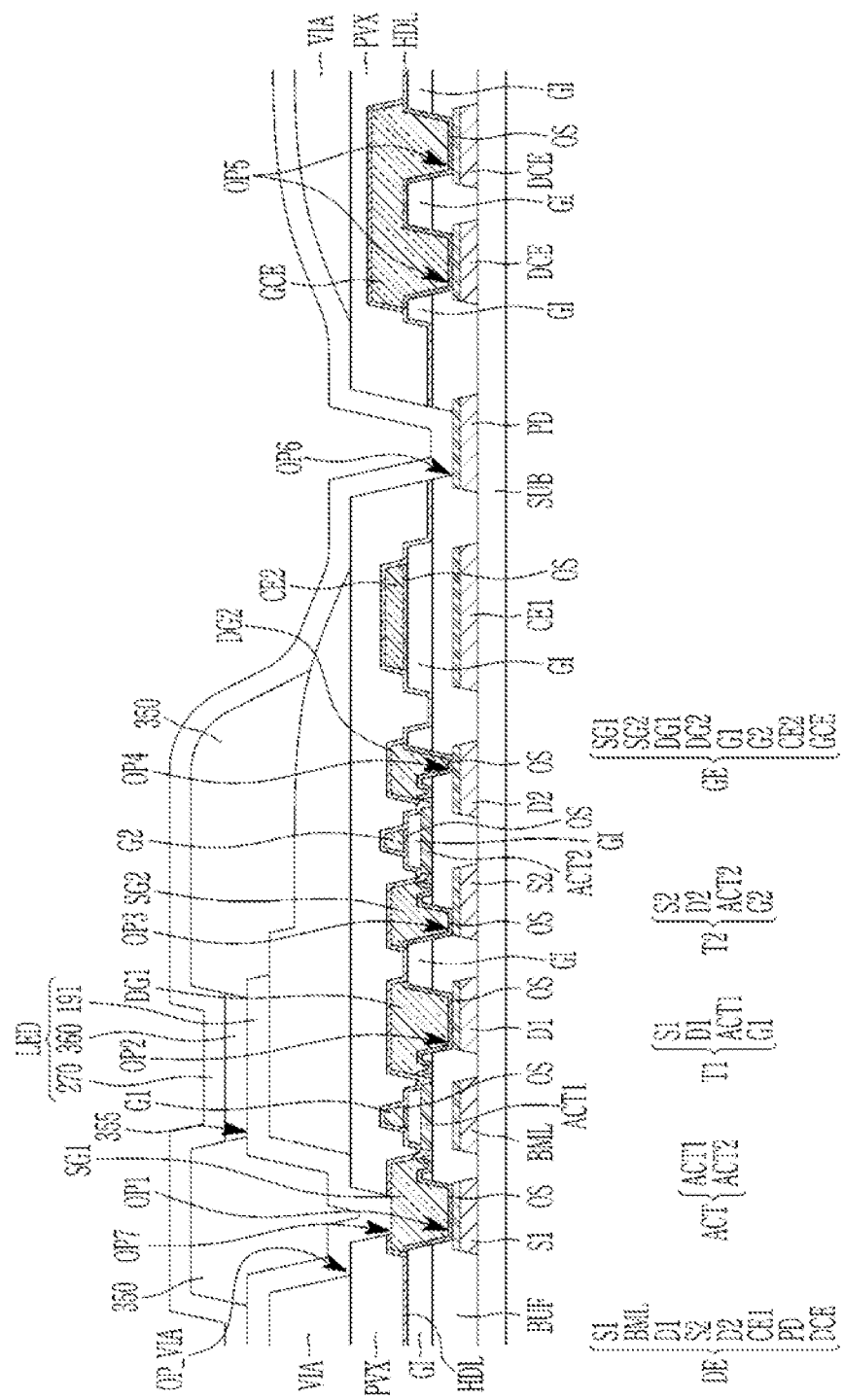
FIG. 20 is the same cross-section as that of FIG. 1 for a display device according to an embodiment.

FIG. 20 shows the same cross-section as that of FIG. 1 for a display device according to an embodiment. Referring to FIG. 20, a display device according to a present embodiment is the same as a display device of FIG. 1, except that the first semiconductor layer ACT1 and the second semiconductor layer ACT2 each include a groove that is covered by the gate conductive layer GE. A detailed description for the same constituent element is omitted. That is, as shown in FIG. 20, the first source connection electrode SG1 overlaps the groove of the first semiconductor layer ACT1 in the direction perpendicular to the surface of the substrate SUB, and the first drain connection electrode DG1 overlaps the groove of the first semiconductor layer ACT1 in the direction perpendicular to the surface of the substrate SUB.

Likewise, in an embodiment, the second source connection electrode SG2 overlaps the groove of the second semiconductor layer ACT2 in the direction perpendicular to the surface of the substrate SUB, and the second drain connection electrode DG2 overlaps the groove of the second semiconductor layer ACT2 in the direction perpendicular to the surface of the substrate SUB.

Figure 21:
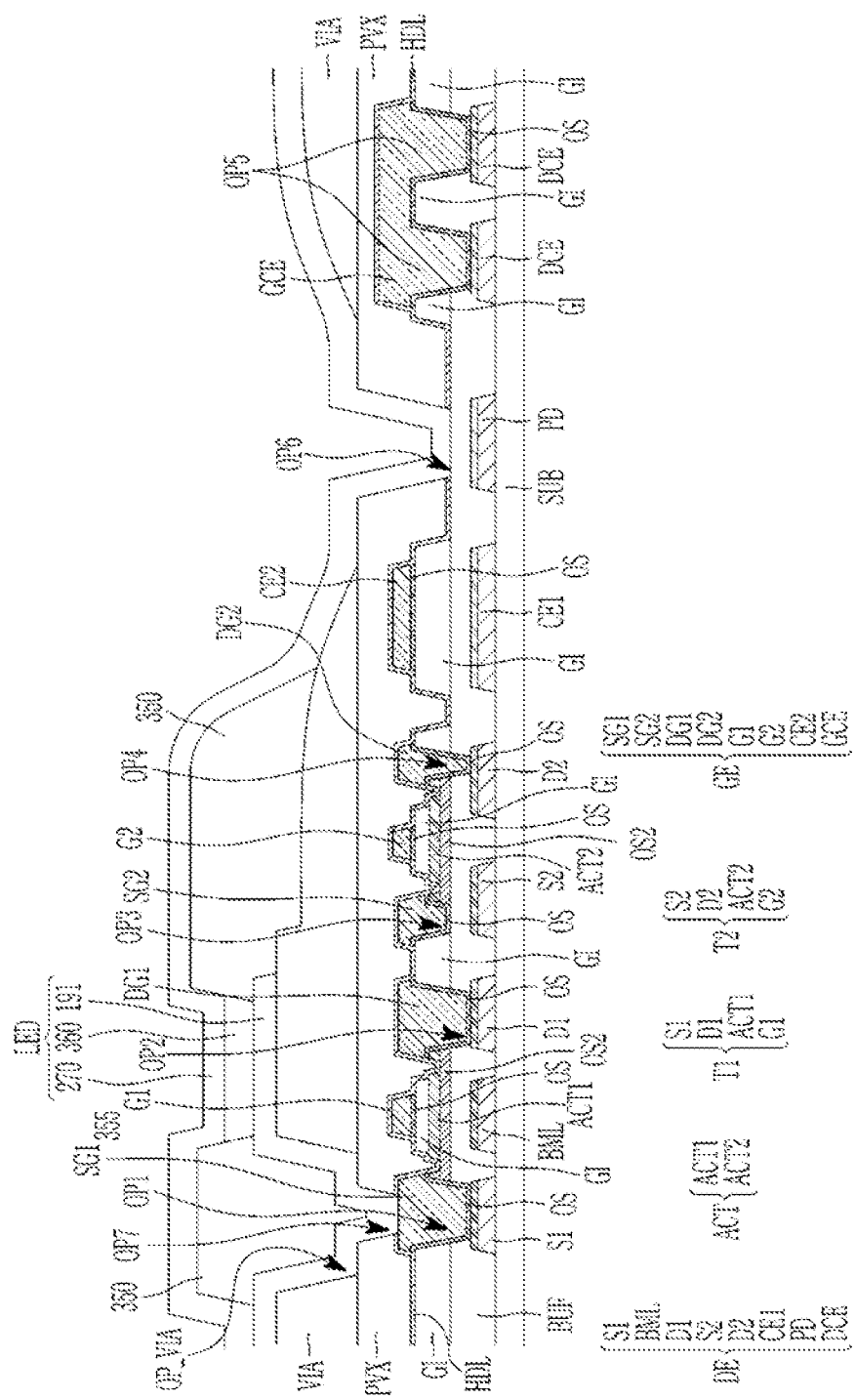
FIG. 21 is the same cross-section as that of FIG. 1 for a display device according to an embodiment.

FIG. 21 shows the same cross-section as that of FIG. 1 for a display device according to an embodiment. Referring to FIG. 21, a display device according to a present embodiment is the same as that of an embodiment of FIG. 1, except for further including a second oxygen supply layer OS2 positioned under the semiconductor layer ACT. A detailed description for the same constituent elements is omitted. Referring to FIG. 21, by being patterned by the same process as the semiconductor layer ACT, the second oxygen supply layer OS2 is formed that has the same planar shape as the semiconductor layer ACT. The second oxygen supply layer OS2 includes a metal oxide that includes at least one of indium, zinc, or tin For example, in an embodiment, the second oxygen supply layer OS2 includes one of IGZO, ITO, ITGO, IZO, ZnO, or ITGZO. The second oxygen supply layer OS2 overlaps the first semiconductor layer ACT1 and the second semiconductor layer ACT2 in the direction perpendicular to the surface of the substrate SUB. Since the second oxygen supply layer OS2 is formed on the entire surface before the semiconductor layer ACT is formed, and is patterned together with the semiconductor layer ACT during the patterning process of the semiconductor layer ACT, no additional masks are required, and the number of masks used does not change. In an embodiment that includes the second oxygen supply layer OS2, an oxygen amount and a metal composition ratio of the second oxygen supply layer OS2 and the first oxygen supply layer OS1 may differ.

Figure 22:
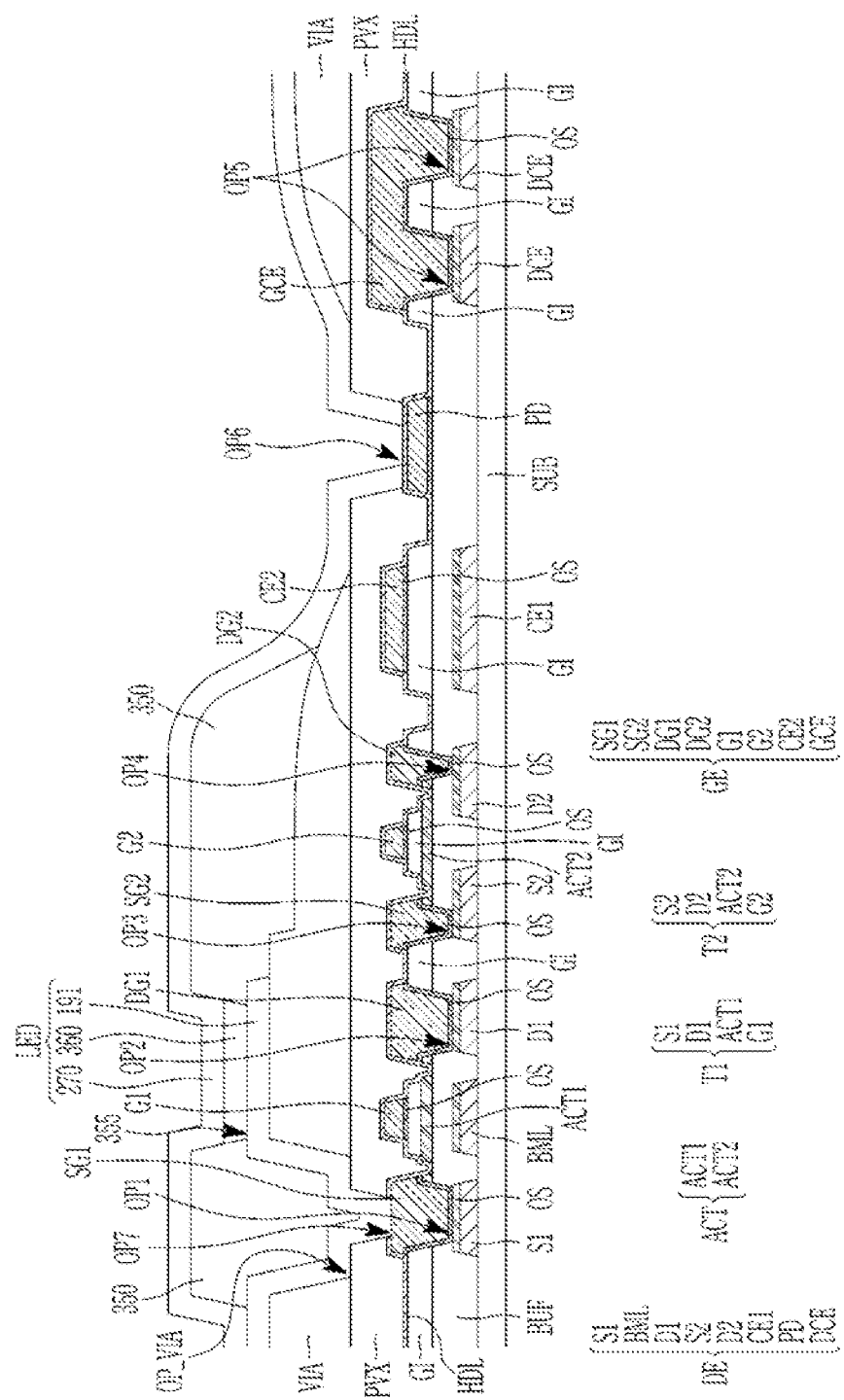
FIG. 22 is the same cross-section as that of FIG. 1 for a display device according to an embodiment.

FIG. 22 shows the same cross-section as that of FIG. 1 for a display device according to an embodiment. Referring to FIG. 22, a display device of a present embodiment is the same as an embodiment of FIG. 1, except that the data conductive layer DE does not include the pad electrode PD, and the pad electrode PD is positioned in the gate conductive layer GE. A detailed description for the same constituent elements is omitted. Referring to FIG. 22, the pad electrode PD of a display device according to a present embodiment is positioned on the same layer as the gate conductive layer GE and includes the same materials as the gate conductive layer GE. Even in this case, the number of masks used in the manufacturing process does not change, so the manufacturing process is economical.

Hereinafter, a planar arrangement diagram of a pixel according to an embodiment of the present disclosure is described with reference to accompanying drawings. However, the planar arrangement diagram described below is only an example, and embodiments of the present disclosure are not limited thereto.

Figure 23:
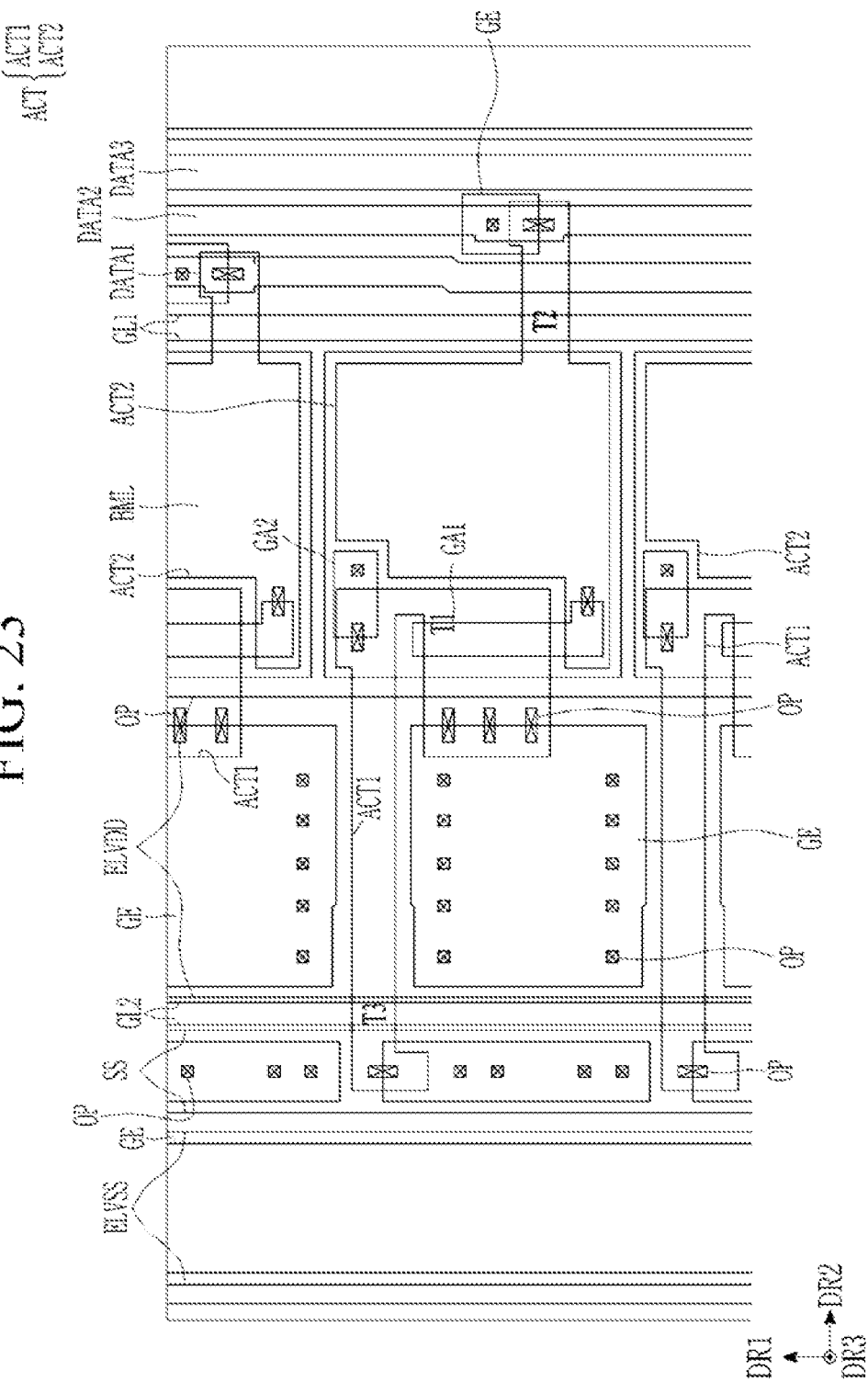
FIG. 23 is a top plan view of a display device according to an embodiment.
Figure 24:
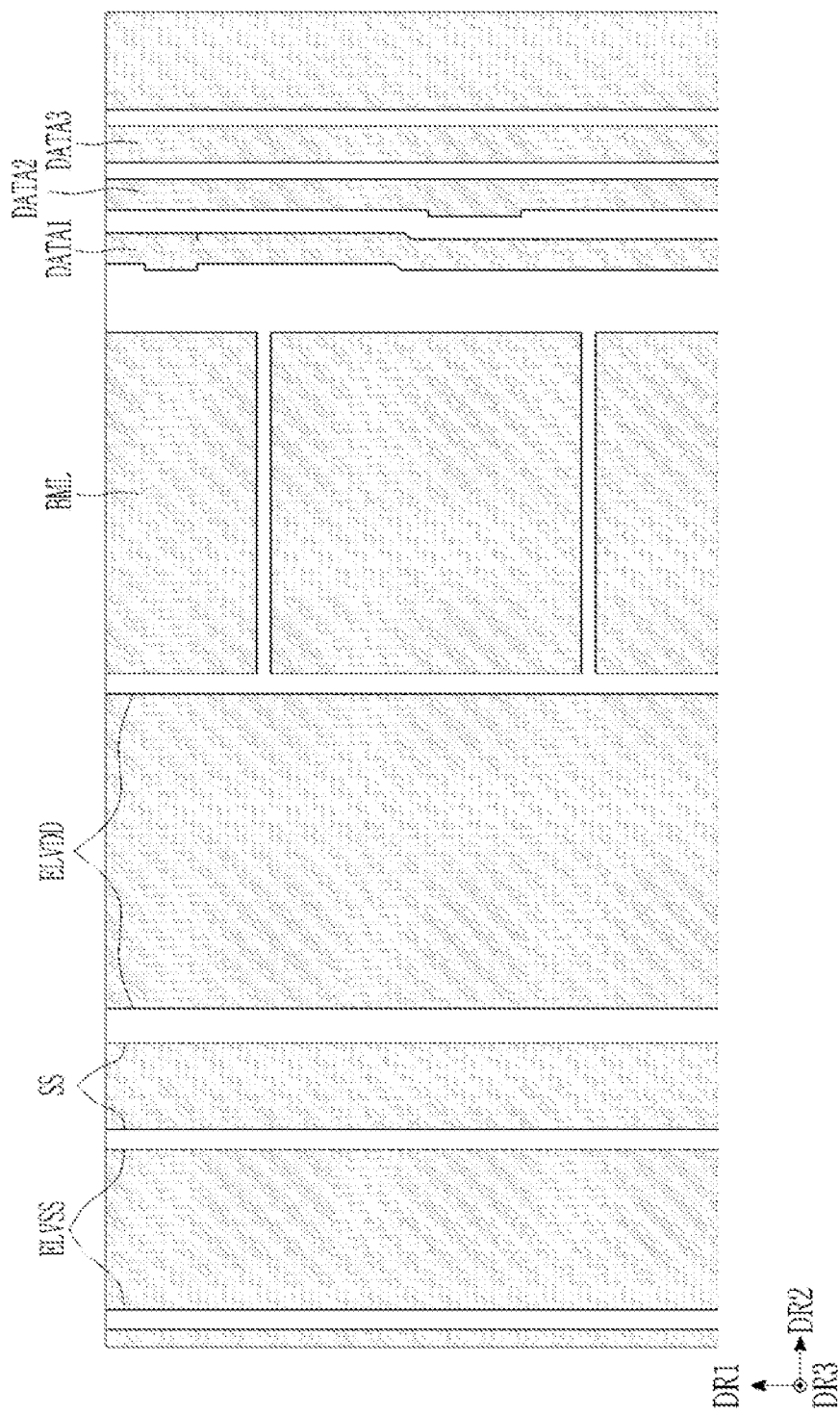
FIG. 24 to FIG. 26 separately and sequentially show a structure positioned on a same layer in a plan view of FIG. 23.
Figure 25:
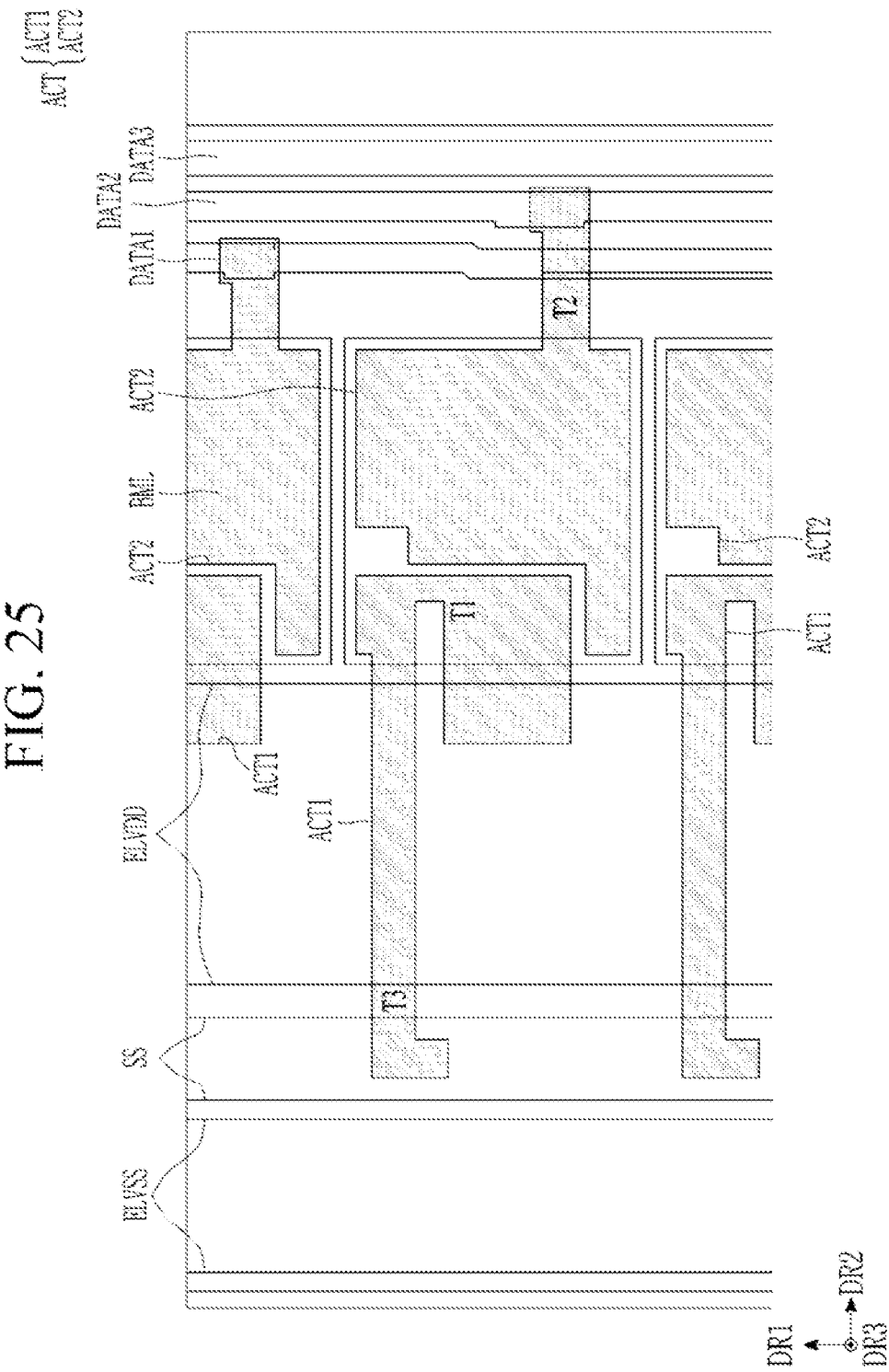
Figure 26:
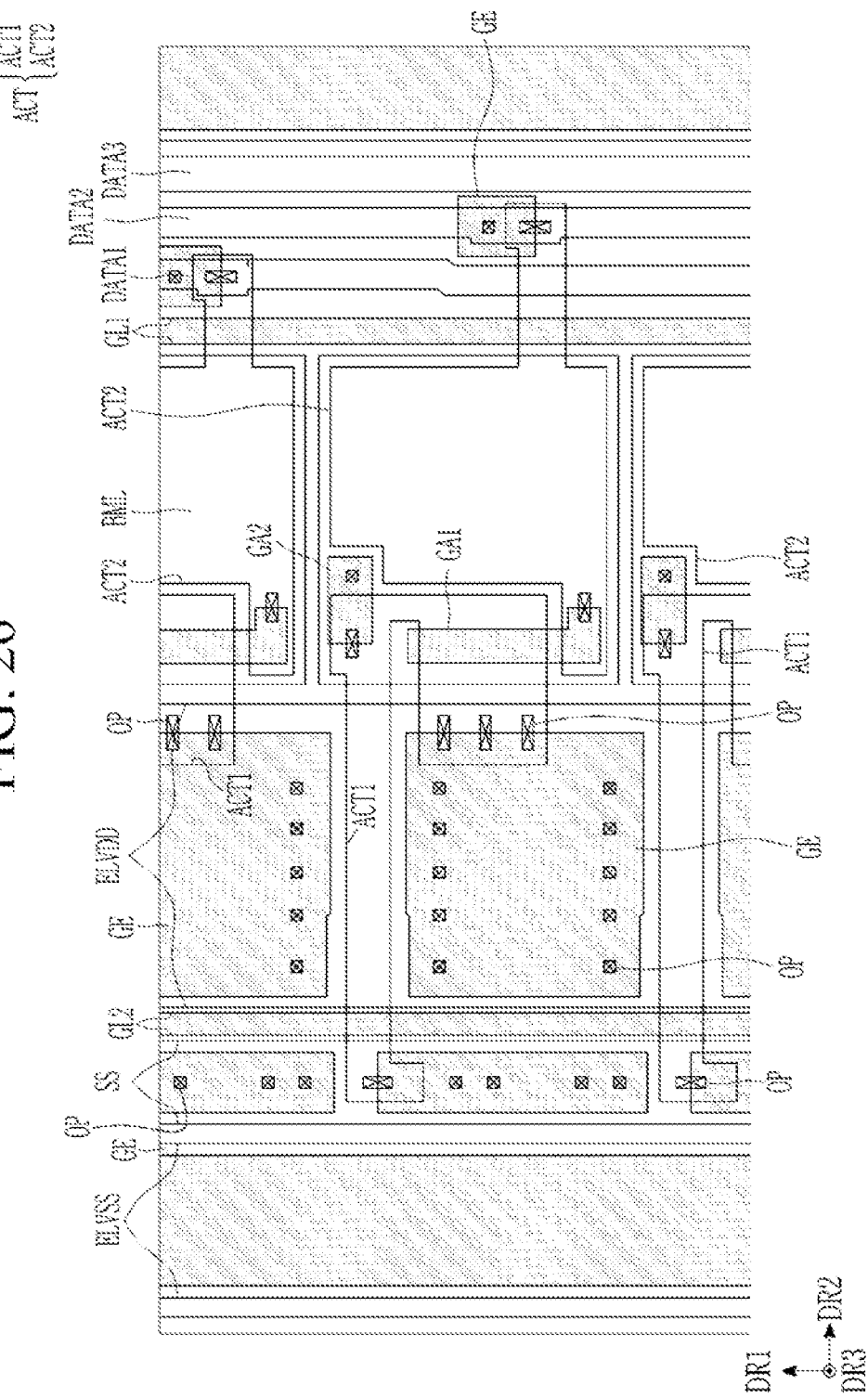

FIG. 23 is a top plan view of a display device according to an embodiment. FIG. 24 to FIG. 26 are views that separately and sequentially show a structure positioned on the same layer in a plan view of FIG. 23.

Referring to FIG. 23 and FIG. 24, a data conductive layer DE that includes ELVSS wiring ELVSS, a sensing wiring SS, ELVDD wiring ELVDD, a light blocking layer BML, a first data line DATA1, a second data line DATA2, and a third data line DATA3 is positioned.

In an embodiment, the data conductive layer DE material includes at least one of aluminum (Al), silver (Ag), magnesium (Mg), gold (Au), nickel (Ni), chromium (Cr), calcium (Ca), molybdenum (Mo), titanium (Ti), tungsten (W), or copper (Cu), etc., and may be a single layer or a multi-layered structure that includes the same. For example, the data conductive layer DE has a double-layer structure that includes titanium and copper.

In an embodiment, the ELVSS wiring ELVSS, the sensing wiring SS, the ELVDD wiring ELVDD, the first data line DATA1, the second data line DATA2, and the third data line DATA3 extend continuously in the first direction DR1. The light blocking layer BML is arranged in the first direction DR1, but is spaced apart for each pixel unit.

Next, in an embodiment, simultaneously referring to FIG. 23 and FIG. 25, a semiconductor layer ACT is positioned on a data conductive layer DE. As shown in FIG. 22 and FIG. 23, the semiconductor layer ACT includes a first semiconductor layer ACT1 and a second semiconductor layer ACT2.

In an embodiment, the first semiconductor layer ACT1 and the second semiconductor layer ACT2 are spaced apart from each other. The first semiconductor layer ACT1 constitute the first transistor T1 and the third transistor T3, and the second semiconductor layer ACT2 constitutes the second transistor T2.

As shown in FIG. 23 and FIG. 25, in an embodiment, the second semiconductor layer ACT2 overlaps the light blocking layer BML and one of the first to third data lines. The first semiconductor layer ACT1 overlaps the sensing wiring SS and the ELVDD wiring ELVDD.

Next, in an embodiment, referring to FIG. 23 and FIG. 26, a gate conductive layer GE is positioned on the semiconductor layer ACT. The gate conductive layer GE overlaps the ELVSS wiring ELVSS, the sensing wiring SS, and the ELVDD wiring ELVDD, and is connected to the data conductive layer DE through a plurality of openings OP. As shown in FIG. 23, a plurality of openings OP1 are formed that overlap the gate conductive layer GE and the semiconductor layer ACT. The gate conductive layer GE includes the first gate line GL1 and the second gate line GL2, which do not overlap the data conductive layer DE, and a part of the first gate line GL1 functions as the gate electrode of the second transistor T2. In addition, a part of the second gate line GL2 functions as the gate electrode of the third transistor T3.

The gate electrodes GA1 and GA2 have island shapes and are positioned in a region that overlaps the light blocking layer BML, and the island-shaped gate electrode GA1 functions as the gate electrode of the first transistor TR1.

In addition, in an embodiment, as described above, an oxygen supply layer that has the same plane shape as the gate conductive layer GE is positioned between the gate conductive layer GE and the substrate and overlaps the gate conductive layer GE.

In addition, a hydrogen diffusion prevention layer is positioned on the gate conductive layer GE.

The structure described in FIG. 23 to FIG. 26 is only an example, and embodiments of a structure of a present disclosure are not limited thereto.

While embodiments of this disclosure have been described in connection with what is presently considered to be practical embodiments, it is to be understood that embodiments of the disclosure are not limited to disclosed embodiments. On the contrary, it is intended to cover various modifications and equivalent arrangements included within the spirit and scope of the appended claims.

What is claimed is:
1. A display device, comprising:
a substrate;
a first conductive layer positioned on the substrate;
a semiconductor layer positioned on the first conductive layer;
a second conductive layer positioned on the semiconductor layer;

an oxygen supply layer positioned under the second conductive layer, in contact with the second conductive layer and having the same planar shape as the second conductive layer;

a light-emitting element connected to the second conductive layer;

an insulating layer positioned between the second conductive layer and the light-emitting element; and a metal oxide layer positioned between the insulating layer and the second conductive layer, wherein the oxygen supply layer includes a metal oxide that includes one or more of indium, zinc, tin, or gallium, or alloys thereof.

2. The display device of claim 1, wherein
the oxygen supply layer is one of IGZO, ITO, ITGO, IZO, ZnO, or ITGZO.

3. The display device of claim 1, wherein
the semiconductor layer is an oxide semiconductor.

4. The display device of claim 3, wherein
a composition of the oxygen supply layer and a composition of the semiconductor layer are different.

5. The display device of claim 1, wherein
the metal oxide layer includes an oxide layer of at least one of aluminum, nickel, lanthanum, or AlNiLa, or alloys thereof.

6. The display device of claim 5, wherein
a thickness of the metal oxide layer is 200 Å or less.

7. The display device of claim 1, wherein
the first conductive layer includes a light blocking layer that overlaps the semiconductor layer in a direction perpendicular to a surface of the substrate, and a source electrode and a drain electrode positioned on a same layer as the light blocking layer, and
the second conductive layer includes a gate electrode that overlaps the semiconductor layer in the direction perpendicular to the surface of the substrate.

8. The display device of claim 7, wherein
a groove is formed in a region of the semiconductor layer that does not overlap the gate electrode in the direction perpendicular to the surface of the substrate, and
the metal oxide layer is directly in contact with a side of the semiconductor layer in the groove.

9. The display device of claim 7, further comprising
a gate insulating layer positioned on the semiconductor layer,
wherein a groove is formed in a region of the semiconductor layer that does not overlap the gate electrode in the direction perpendicular to the surface of the substrate, and
the oxygen supply layer and the semiconductor layer are directly in contact in the groove.

10. The display device of claim 1, further comprising:
a buffer layer positioned on the first conductive layer; and
a second oxygen supply layer positioned between the buffer layer and the semiconductor layer, wherein
the second oxygen supply layer includes a metal oxide that includes one or more of indium, zinc, tin, or gallium, or alloys thereof.

11. The display device of claim 1, further comprising
a pad electrode positioned on the same layer as the first conductive layer or the second conductive layer.

12. A display device, comprising:
a substrate;
a first conductive layer positioned on the substrate;
a semiconductor layer positioned on the first conductive layer;

a second conductive layer positioned on the semiconductor layer;

a light-emitting element connected to the second conductive layer;

an insulating layer positioned between the second conductive layer and the light-emitting element; and a metal oxide layer positioned between the insulating layer and the second conductive layer, wherein the metal oxide layer includes an oxide layer of at least one of aluminum, nickel, lanthanum, or AlNiLa, or alloys thereof, and a thickness of the metal oxide layer is 200 Å or less.

13. The display device of claim 12, wherein
the second conductive layer includes a gate electrode that overlaps the semiconductor layer in a direction perpendicular to a surface of the substrate,
a groove is formed in a region of the semiconductor layer that does not overlap the gate electrode in the direction perpendicular to the surface of the substrate, and
the metal oxide layer is directly in contact with a side of the semiconductor layer in the groove.

14. The display device of claim 12, further comprising:
an oxygen supply layer positioned under the second conductive layer, in contact with the second conductive layer and having the same planar shape as the second conductive layer,
wherein the oxygen supply layer includes a metal oxide that includes one or more of indium, zinc, tin, or gallium, or alloys thereof.

15. The display device of claim 14 wherein
the oxygen supply layer is one of IGZO, ITO, ITGO, IZO, ZnO, or ITGZO, and
the semiconductor layer is an oxide semiconductor.

16. The display device of claim 15, further comprising
a gate insulating layer positioned on the semiconductor layer,
wherein the second conductive layer includes a gate electrode that overlaps the semiconductor layer in a direction perpendicular to a surface of the substrate
a groove is formed in a region of the semiconductor layer that does not overlap the gate electrode in the direction perpendicular to the surface of the substrate, and
the oxygen supply layer and the semiconductor layer are directly in contact in the groove.

17. The display device of claim 14, further comprising:
a buffer layer positioned on the first conductive layer; and
a second oxygen supply layer positioned between the buffer layer and the semiconductor layer, wherein
the second oxygen supply layer includes a metal oxide that includes one or more of indium, zinc, tin, or gallium, or alloys thereof.

18. The display device of claim 12, wherein
the first conductive layer includes a light blocking layer that overlaps the semiconductor layer in a direction perpendicular to a surface of the substrate, and a source electrode and a drain electrode positioned on a same layer as the light blocking layer.

19. An electronic device, comprising:
a substrate;
a first conductive layer positioned on the substrate;
a semiconductor layer positioned on the first conductive layer;
a second conductive layer positioned on the semiconductor layer;

an oxygen supply layer positioned under the second conductive layer, in contact with the second conductive layer and having the same planar shape as the second conductive layer;

a light-emitting element connected to the second conductive layer;

an insulating layer positioned between the second conductive layer and the light-emitting element; and a metal oxide layer positioned between the insulating layer and the second conductive layer, wherein the oxygen supply layer includes a metal oxide that includes one or more of indium, zinc, tin, or gallium, or alloys thereof.

20. The electronic device of claim 1, wherein the oxygen supply layer is one of IGZO, ITO, ITGO, IZO, ZnO, or ITGZO.

* * * * *